(12) United States Patent
Kanno et al.

(10) Patent No.: US 7,098,967 B2
(45) Date of Patent: Aug. 29, 2006

(54) RECEIVING APPARATUS

(75) Inventors: Ippei Kanno, Kyotanabe (JP); Hiroaki Ozeki, Osaka (JP); Yasuo Oba, Otsu (JP); Akira Fujishima, Ichinomiya (JP); Mineyuki Iwaida, Nagaokakyo (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 298 days.

(21) Appl. No.: 10/247,749

(22) Filed: Sep. 20, 2002

(65) Prior Publication Data

US 2003/0071925 A1    Apr. 17, 2003

(30) Foreign Application Priority Data

Oct. 2, 2001  (JP) ............................. 2001-306121

(51) Int. Cl.
*H04N 5/455* (2006.01)

(52) U.S. Cl. .................. 348/726; 348/641; 348/725; 375/260; 375/326

(58) Field of Classification Search ........ 348/725–726, 348/731, 737, 641; 375/326, 260–261, 285, 375/324, 327, 342, 340, 344, 346, 362, 364, 375/222, 316, 329, 332; 370/206, 208; H04N 5/455
See application file for complete search history.

(56) References Cited

U.S. PATENT DOCUMENTS

| | | | |
|---|---|---|---|
| 5,414,736 A * | 5/1995 | Hasegawa et al. .......... 375/334 |
| 5,694,389 A * | 12/1997 | Seki et al. .................... 370/208 |
| 6,057,876 A * | 5/2000 | Waight ........................ 725/151 |
| 6,133,964 A * | 10/2000 | Han ............................ 348/726 |
| 6,292,518 B1 * | 9/2001 | Grabb et al. ................. 375/321 |
| 6,356,598 B1 * | 3/2002 | Wang .......................... 375/321 |
| 6,377,315 B1 | 4/2002 | Carr et al. |
| 6,396,550 B1 * | 5/2002 | Oh ............................. 348/735 |
| 6,678,012 B1 * | 1/2004 | Belotserkovsky ........... 348/731 |
| 6,704,374 B1 * | 3/2004 | Belotserkovsky et al. ... 375/326 |
| 6,744,828 B1 * | 6/2004 | Uchiyama et al. ........... 375/326 |

FOREIGN PATENT DOCUMENTS

| | | |
|---|---|---|
| JP | 2001-77648 A | 3/2001 |
| WO | WO 00/11794 A | 3/2000 |
| WO | WO 00/11795 A | 3/2000 |

OTHER PUBLICATIONS

Hidenori Takeuchi et al., A Single-Chip RF Front-End for the Digital Sound Broadcasting, WAM 10.8, 2001, pp. 114-115, IEEE.

* cited by examiner

*Primary Examiner*—Trang U. Tran
(74) *Attorney, Agent, or Firm*—Smith Patent Office

(57) ABSTRACT

Frequency conversion into a first intermediate frequency which is higher than a received frequency band is performed for a received signal by using a mixer and a PLL. Next, an output of the mixer is frequency converted into a second intermediate frequency of a base band by using a quadrature mixer formed by mixers and a phase shifter. At this time, a frequency of the local oscillation signal of a PLL supplied to the quadrature mixer is controlled so as to be switched, depending on a position of the received segment, between a frequency which is higher than the first intermediate frequency and a frequency which is lower than the same.

6 Claims, 21 Drawing Sheets

$fLO = fRF - fIF$ $fLO = fRF + fIF$

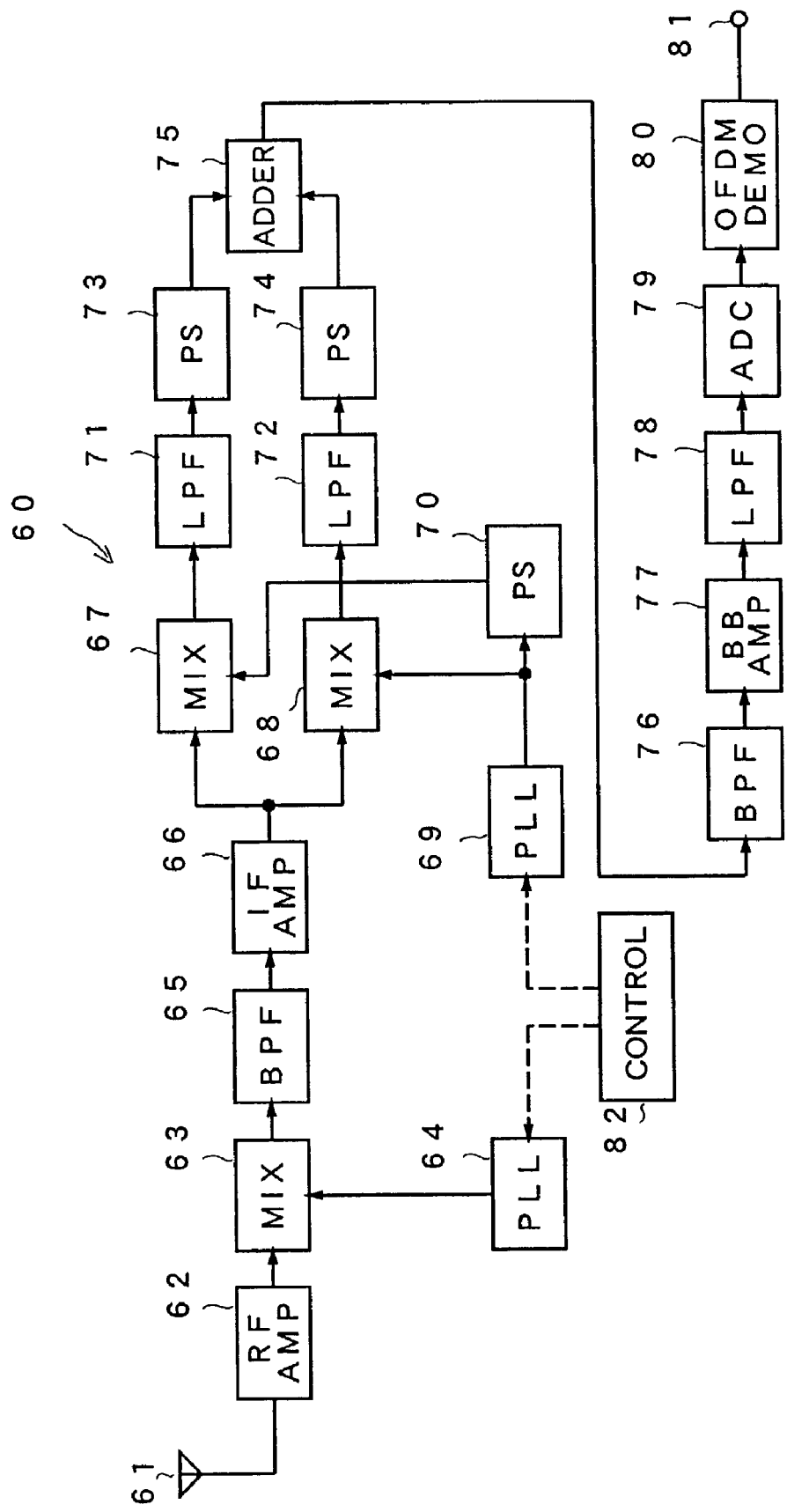

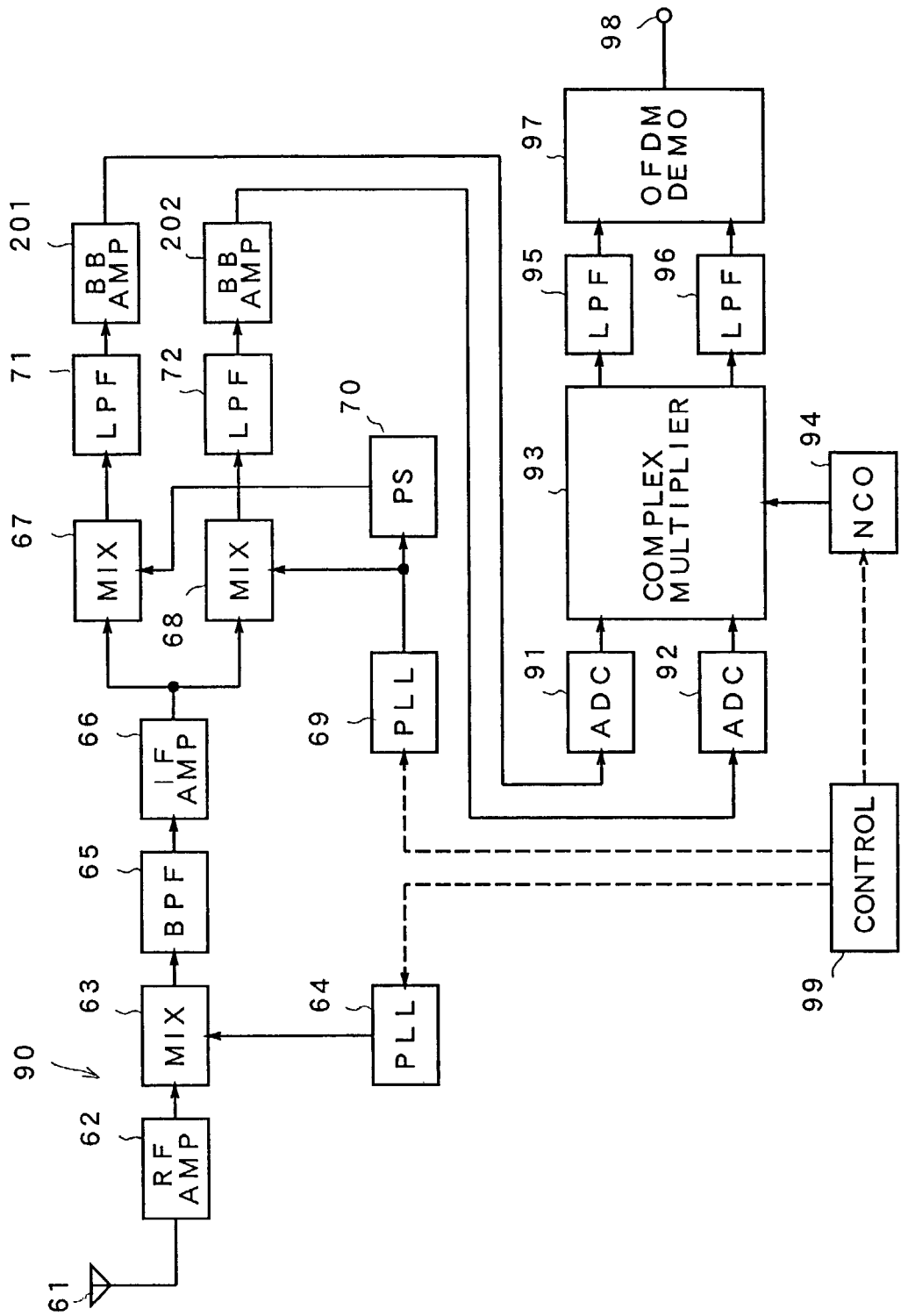

F I G. 1 5
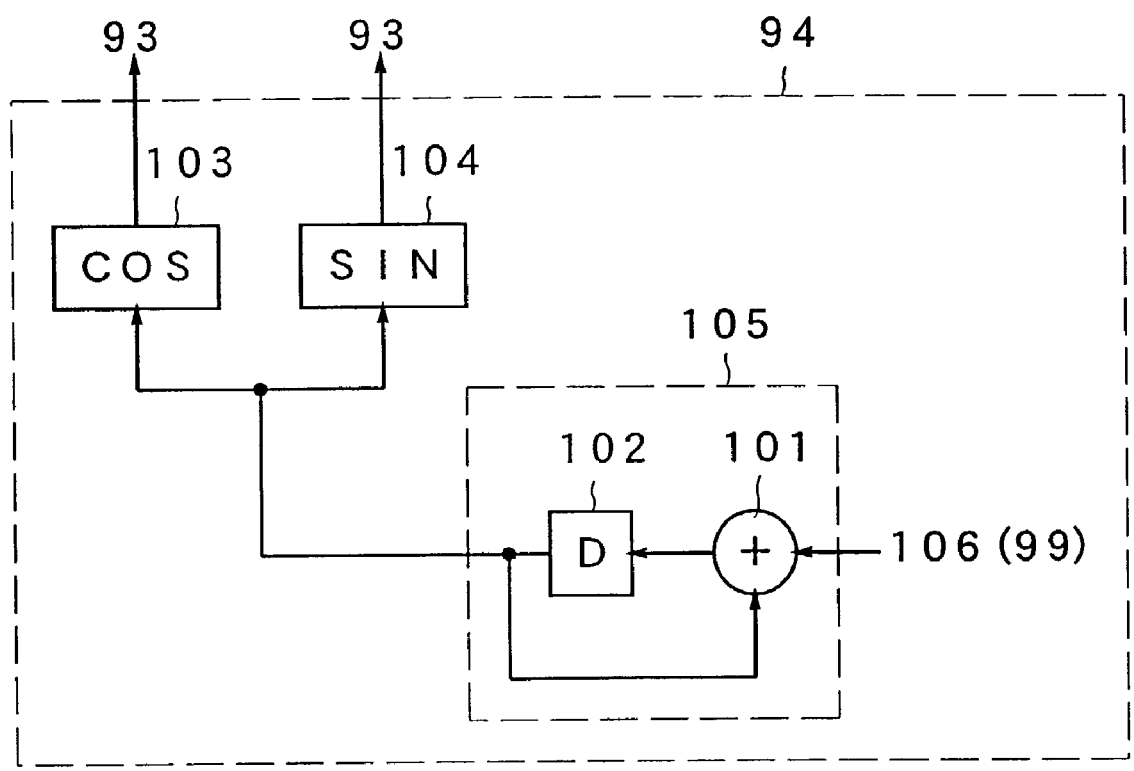

RECEIVING APPARATUS

BACKGROUND OF THE INVENTION

1. Field of the Invention

The present invention relates to a receiving apparatus in digital terrestrial broadcasting.

2. Description of the Related Art

A receiving apparatus disclosed in Japanese Unexamined Patent Publication No. 2001-77648 has been known as a conventional one. Hereinafter, prior art relating to the present invention will be described with reference to the drawings.

FIG. 1 is a configuration view of a receiving apparatus according to a first conventional example. The receiving apparatus includes an antenna 1, an RF amplifier 2, mixers 7, 8, a PLL 9, a divider 10, low pass filters (LPF) 11, 12, phase shifters 13, 14, an adder 15, a band pass filter (BPF) 16, a base band amplifier (BB amplifier) 17, an LPF 18, an AD converter (ADC) 19, an OFDM demodulator 20 and a transport stream output terminal (TS output terminal) 21.

An ISDB-T signal is inputted to the antenna 1. ISDB-T is a standard for digital terrestrial broadcasting which will start from 2003 in Japan. In a UHF band, TV broadcasting will start that has thirteen segments with a bandwidth of 429 kHz that are connected and subjected to OFDM modulation and a resultant OFDM signal is transmitted at a band of 6 MHz. A stationary receiver substituted by a conventional home TV can receive the whole thirteen segments and enjoy the high-vision broadcasting service. A transmission system in which only one segment serving as a central segment of thirteen segments can be received is also provided. In this case, services for a mobile receiver with a simple structure can be provided.

On the other hand, in the VHF band, sound broadcasting that has eight or twelve segments with a bandwidth of 429 kHz are connected and subjected to OFDM modulation and a resultant signal is transmitted at a band of 4 or 6 MHz. The sound broadcasting provides a service that each of the segments is dependent. In a specification of this case, any one segment is cut and partially received. Similar to TV, services for a mobile receiver with a simple structure can be provided.

The receiving apparatus with the structure shown in FIG. 1 is a receiving apparatus which performs partial reception of one segment in the above-described TV broadcasting and sound broadcasting. An ISDB-T signal received by the antenna 1 is amplified by the RF amplifier 2 and a resultant amplified signal is inputted to a quadrature mixer formed of the mixers 7 and 8. An oscillation signal with a predetermined frequency is generated at the PLL 9 and the oscillation signal is supplied to the divider 10. The divider 10 divides the signal into two signals that have frequencies higher than a center frequency of the segment to be partially received by 500 kHz and whose phases are different from each other by 90°. The divided signal is supplied to the mixers 7 and 8 as a local oscillation signal.

A method of dividing frequency into four is utilized for the divider 10 in order to obtain a phase difference of 90° with high precision by a frequency-dividing operation. When a segment with a center frequency of fRF is received, an oscillation frequency of the PLL 9 is 4×(fRF+500 kHz). A range of oscillation frequency of the PLL 9 can be made narrow by using frequency-halving. In accordance with the frequency-dividing method, a balance signal with a frequency which is twice as large as a required frequency is generated and a positive and negative phase signals are divided into two, so that signals with a phase difference of 90° are generated. In accordance with this frequency-dividing method, a quadrature precision is inferior as compared to the method of dividing frequency into four. In this case, an oscillation frequency of the PLL 9 is 2×(fRF+500 kHz). In this way, the mixer circuits 7 and 8 convert received signals into two intermediate frequency signals whose phases are different from each other by 90°. As a result, signals of an intermediate frequency of 500 kHz with the I axis and Q axis perpendicular to each other are generated.

Then, the intermediate frequency signals from the mixers 7 and 8 are supplied via the LPF 11 and LPF 12 to the phase shifters 13 and 14. The phase shifter 13 phase-shifts an I axis intermediate frequency signal serving as an output of the mixer 7 by $\phi$. The phase shifter 14 phase-shifts a Q axis intermediate frequency signal serving as an output of the mixer 8 by ($\phi$+90°). The phase-shifted intermediate frequency signals are supplied to the adder 15. The adder 15 adds an output of the phase shifter 13 to an output of the phase shifter 14 so as to output an intermediate frequency signal that an image signal component is cancelled and only a desired signal component is contained.

A quadrature mixer and an image rejection mixer that perform an important function in the receiving apparatus will be described. FIGS. 2 and 3 are functional block diagrams showing a structure of the image rejection mixer. FIG. 2 is a functional block diagram in a case of canceling a lower side band. FIG. 3 is a functional diagram in a case of canceling an upper side band.

An image rejection mixer 30A shown in FIG. 2 is configured so as to include a first mixer 31a, a second mixer 31b, a local oscillator 32, a first phase shifter 33, a first low pass filter (LPF) 34a, a second LPF 34b, a second phase shifter 35A and an adder 36. When a signal with an angular frequency of $\omega$ is subjected to amplitude modulation by using an input signal with an angular frequency of p, a $\cos(\omega-p)$ t component, a $\cos \omega t$ component and a $\cos(\omega+p)$ t component can be obtained as a modulated signal. $\cos(\omega+p)$ t is referred to as an upper side band and $\cos(\omega-p)$ t is referred to as a lower side band. Here, $\omega > p$.

The local oscillator 32 oscillates a reference signal $\cos \omega t$. The signal of $\cos \omega t$ is inputted to the phase shifter 33. The phase shifter 33 outputs $\cos \omega t$ and $\sin \omega t$ whose phase is different from that of $\cos \omega t$ by 90°. When Vin=$\cos(\omega-p)$ t+$\cos \omega t$+$\cos(\omega+p)$ t is inputted to the image rejection mixer 30A, the mixer 31a multiplies Vin by $\cos \omega t$. The LPF 34a removes a high band component of the multiplied signal and passes component with frequencies equal to or lower than a frequency p. As a result, cos pt is extracted with respect to the lower side band $\cos(\omega-p)$ t and cos pt is extracted with respect to the upper side band $\cos(\omega+p)$ t.

The mixer 31b multiplies Vin by $\sin \omega t$. The LPF 34b removes a high band component of the multiplied signal and passes components with frequencies equal to or lower than a frequency p. As a result, sin pt is extracted with respect to the lower side band $\cos(\omega-p)$ t and −sin pt is extracted with respect to the upper side band $\cos(\omega+p)$ t. The phase shifter 35A advances, by 90°, phases of outputs of the LPF 34b sin pt and −sin pt and converts them into −cos pt and +cos pt. When converted components of the lower side band are inputted, the adder 36 adds +cos pt to −cos pt and outputs only a DC component. Further, when converted components of the upper side band are inputted, the adder 36 adds +cos pt to +cos pt and outputs a signal of 2 cos pt. In this way, the lower side band is cancelled and only the component of the upper side band remains. Accordingly, the circuit shown in FIG. 2 serves as an image rejection mixer for canceling lower side band.

Structural elements of an image rejection mixer 30B shown in FIG. 3 are the same as those of FIG. 2 except that the phase shifter 35A shown in FIG. 2 is substituted by the phase shifter 35B and a phase is delayed by 90°. In this case, the image rejection mixer for canceling upper side band can be obtained. Referring to FIGS. 2 and 3, a circuit formed by the first mixer 31a, the second mixer 31b, the local oscillator 32 and the first phase shifter 33 is referred to as a quadrature mixer.

FIGS. 4A and 4B are spectral diagrams showing a channel where an analog TV signal is broadcast and an empty channel where an analog TV signal is not broadcast in a conventional VHF band. When digital terrestrial broadcasting formed by OFDM modulation or another modulation system is provided for an empty channel such as a taboo channel or the like, the conventional analog TV signal is positioned at an upper or a lower adjacent frequency band of the channel for digital broadcasting. FIG. 4A shows a case of receiving an upper side segment of a digital terrestrial sound broadcasting. FIG. 4B shows a case of receiving a lower side segment.

An above-described example of setting a frequency at the PLL 9 corresponds to FIG. 4B. An output of the divider 10 is a local oscillator frequency fLO by frequency conversion. An image rejection operation at this case suppresses an upper frequency component of the local oscillator frequency. For frequency conversion not by an image rejection mixer but by an ordinary mixer, frequency components positioned at a value of the upper 500 kHz of the local oscillator frequency (fLO+500 kHz) and at a value of the lower 500 kHz thereof (fLO−500 kHz) are converted into an intermediate frequency of 500 kHz. Since disturbance occurs in such frequency conversion, frequency components at unnecessary sides must be removed by a filer prior to the frequency conversion. An image rejection mixer has an advantage that such a filter prior to the frequency conversion is not required. Nevertheless, a degree of image suppression is deteriorated by quadrature errors of two local oscillation signals generated at the divider 10, quadrature errors of the phase shifters 13 and 14 and a difference of amplitude between an I axis intermediate frequency signal and a Q axis intermediate frequency signal. Thus, it is usually difficult to ensure a high degree of image suppression exceeding 30 dB.

Referring to FIG. 1, an intermediate frequency signal outputted from the adder 15 is supplied to the BPF 16. A center frequency of the BPF 16 is 500 kHz and a passband width thereof is equal to or larger than one segment. The BPF 16 removes interfering signal components such as other adjacent segments and an analog broadcasting signal of the adjacent channel, and selects a desired received segment.

An output of the BPF 16 is inputted to the base band amplifier (which hereinafter is referred to as BB amplifier) 17. The BB amplifier 17 is an amplifier having an AGC control function. The BB amplifier 17 amplifies an input signal to a set amplitude and supplies a resultant signal to the LPF 18. The LPF 18 removes unnecessary frequency components and supplies a result to the ADC 19. The ADC 19 converts an output of the LPF 18 into a digital signal while maintaining a center frequency at 500 kHz.

An output of the ADC 19 is supplied to the OFDM demodulator 20. The OFDM demodulator 20 performs demodulation processes such as complex Fourier transform, frequency deinterleave, time deinterleave and error correction in accordance with a modulation process at a time of sending ISDB-T. A demodulated result is outputted to the TS output terminal 21 as a transport stream (TS). A subsequent back end (not shown) reproduces a voice and an audio signal by decoding TS.

When TV broadcasting of ISDB-T for UHF band and sound broadcasting for VHF band are received, a receiver must receive a signal with a wide-band of 90 MHz to 770 MHz. In accordance with the structure of the conventional example, a local oscillator oscillates at a frequency twice or four times larger than a received frequency in order to ensure quadrature precision of the quadrature detection. Thus, an oscillation frequency of the local oscillator has a significant wide-band. When IC is performed such that a resonance circuit of the oscillator is built, a band must be divided into plural bands. At this time, since resonance circuits corresponding to the number of bands are required, a scale of the circuit is increased and thus the IC of the tuner portion is difficult. When a quadrature signal is generated not by a divider but by a phase shifter, it is difficult to ensure quadrature precision at a wide-band. Under such circumstances, it is required to realize a receiving apparatus which can receive a wide-band from VHF to UHF.

In order to solve such a drawback, a receiving apparatus of the second conventional example (U.S. Pat. No. 6,377, 315) is provided. FIG. 5 shows a structure of the receiving apparatus. The receiving apparatus is configured so as to include an RF input terminal 41, an RF-AGC 42, a mixer 43, a first PLL 44, a first band pass filter (BPF) 45, a first mixer 46, a second mixer 47, a first poly phase filter (POLY PHASE) 48, a second PLL 49, a second poly phase filter 50, a second band pass filter (BPF) 51, an IF-AGC 52 and an output terminal 53.

An RF signal of VHF or UHF inputted from the RF input terminal 41 has a frequency band of 50 to 860 MHz, and is inputted to the RF-AGC amplifier 42 and amplified therein. The RF-AGC amplifier 42 is formed by a variable attenuation circuit and a low noise amplifier (LNA). An output of the RF-AGC amplifier 42 is inputted to the mixer 43. The PLL 44 is a local oscillator which oscillates at a frequency with a band of 1270 to 2080 MHz. The mixer 43 mixes an output of the RF-AGC amplifier 42 with an output of the PLL 44 so as to perform frequency conversion into a first intermediate frequency fIF1. The first intermediate frequency fIF1 is 1220 MHz.

The BPF 45 passes a signal component with the frequency fIF1 and removes adjacent signals. An output of the BPF 45 is inputted to the mixers 46 and 47. The PLL 49 oscillates a reference signal of 1176 MHz. The poly phase filter 48 converts the reference signal from the PLL 49 into two signals with a phase difference thereof being 90° and the signals are respectively applied to the mixers 46 and 47. The mixers 46 and 47 perform frequency conversion for a signal of frequency fIF1 by using a quadrature output of the poly phase filter 48.

The poly phase filter 50 composites output signals of the mixers 46 and 47 with a phase difference of 90° so as to remove an image band component. An image band refers to as a frequency component (fIF1−2×fIF2) wherein a frequency of the second intermediate frequency signal is fIF2. When an image rejection mixer is not used, conversion into a frequency fIF2 is performed as in a case of the frequency fIF1. If fIF2>>fIF1, an attenuation of the BPF 45 cannot be sufficiently ensured at an image band. Thus, an image rejection mixer is used in order to complement the attenuation. The BPF 51 passes the second intermediate frequency signal of the frequency fIF2 and removes adjacent signal components. Thereafter, the IF-AGC amplifier 52 adjusts amplitude to an optimum input level of the subsequent demodulation circuit (not shown) and outputs a result to the IF output terminal 53.

As described above, in accordance with the receiving apparatus of a second conventional example, image rejection is performed at a fixed frequency fIF1. Thus, reception in a wide-band such as VHF and UHF can be performed while ensuring a precision of image rejection.

Next, a case of receiving digital terrestrial sound broadcasting (ISDB-TSB) will be considered. In accordance with the digital terrestrial sound broadcasting, a service is independent for each segment. Thus, by receiving only one desired segment and performing a demodulation process for the segment, the sound broadcasting can be received. Above-described FIGS. 4A and 4B show a frequency spectrum for digital terrestrial sound broadcasting in a specific channel with 4 MHz of irregular bandwidth for analog TV broadcasting. The specific channel is the 7-th channel. In Tokyo and Osaka, practical test broadcasting for digital terrestrial sound broadcasting will take effect from the end of 2003.

In the channel, eight segments are connected together and broadcasted. FIG. 4A shows a case of receiving the top segment of eight segments. At this time, in order to suppress disturbance from picture carrier for upper adjacent analog TV broadcasting, a local oscillator (LO) for detection sets a frequency to this that is lower than a center frequency fRF of received segment by fIF. Then, the image rejection mixer operates so as to suppress signal components lower than fLO. If an LO is set so as to have a frequency which is higher than that of the received segment by the intermediate frequency fIF and signal components higher than fLO are suppressed by the image rejection mixer, a picture carrier of the upper adjacent NTSC signal must be suppressed. At this time, if the power of the interfering signal is relatively large, suppression cannot be performed thoroughly. Accordingly, when an intermediate frequency fIF is set to around 500 kHz and at least first and second segments from the upper end are received, the setting as shown in FIG. 4A is required.

On the other hand, FIG. 4B shows a case of receiving the bottom segment of eight segments. In order to suppress disturbance from a lower adjacent sound carrier for analog TV broadcasting, an LO for detection sets a frequency which is higher than a center frequency fRF of the received segment by fIF. Then, the image rejection mixer is operated so as to suppress signal components higher than fLO. Inversely, if the LO is set to a frequency which is lower than that of the received segment by the intermediate frequency fIF and signal components lower than fLO are suppressed by the image rejection mixer, the sound carrier of the lower adjacent NTSC signal must be suppressed. At this time, if the power of interfering signal is relatively large, suppression cannot be performed thoroughly. Accordingly, when the intermediate frequency fIF is set to around 500 kHz and at least the first and second segments from the lower end are received, setting as shown in FIG. 4B is required.

Next, a case of receiving all of the thirteen segments of ISDB-T for digital terrestrial TV broadcasting or an OFDM signal such as DVB-T or the like will be considered. FIG. 6A shows a frequency spectral diagram when a lower adjacent NTSC exists. A local oscillator frequency fLO of the image rejection mixer is set so as to satisfy the relationship fLO=fRF+fIF. In this case, the adjacent NTSC signal is outside an image band and thus disturbance of the image is reduced. Similarly, FIG. 6B shows a case where an upper adjacent NTSC exists. The local oscillator frequency fLO of the image rejection mixer is set so as to satisfy the relationship fLO=fRF−fIF. In this case, the adjacent NTSC signal is outside an image band and thus disturbance of the image is reduced.

As described above, in accordance with the image rejection mixer, in order to reduce disturbance of the image, an image band to be removed by the image rejection mixer must be switched between an upper band and a lower band depending on a position of the received segment in a case of digital terrestrial sound broadcasting. In a case of digital terrestrial TV broadcasting, an image band to be removed by the image rejection mixer must be switched between an upper band and a lower band depending on a position of the adjacent interfering signal. In order to realize such switching, the phase shifters 13 and 14 shown in FIG. 1 must be switched. Alternatively, an amount of phase shift of the phase shifters 13 and 14 must be switched. Nevertheless, there arise problems in that a gain difference between an I axis and a Q axis is easily generated by such operation and thus an image rejection performance cannot be sufficiently obtained. Further, in accordance with the structure of FIG. 5, little attenuation of the adjacent NTSC cannot be obtained at the BPF 45. Thus, a band for image rejection must be switched between an upper band and a lower band. There also arises a problem in that an image rejection performance is deteriorated by switching of the phase shifters or an amount of the phase shift.

SUMMARY OF THE INVENTION

The present invention was developed in light of conventional problematic points and an object of the present invention is to provide a receiving apparatus which has a high degree of selection with excellent image rejection performance while realizing wide-band reception from VHF to UHF.

A receiving apparatus of the present invention selects a segment serving as a part of a signal obtained by connecting a plurality of segments and performing digital modulation and receives the same. The receiving apparatus includes a first mixer which performs frequency conversion for a received signal into a first intermediate frequency which is set to be higher than a received frequency band, a second image rejection mixer which performs frequency conversion for an output of the first mixer into a second intermediate frequency which is lower than the first intermediate frequency, and a control section. The control section switches a frequency of a local oscillation signal supplied to the first mixer between a frequency which is higher than a first intermediate frequency and a frequency which is lower, the same depending on a position of the segment of the received signal.

A receiving apparatus of the present invention includes a first mixer which performs frequency conversion for a received signal into a first intermediate frequency set to be higher than a received frequency band of the received signal, a second quadrature mixer which performs quadrature detection for an output of the first mixer by using a local oscillation signal where a frequency offset is set, and a control section. The control section switches a sign of the frequency offset depending on a position of the received segment.

In accordance with the receiving apparatus of the present invention, a signal subjected to digital modulation can be received under a circumstance that an adjacent signal exists. At this case, a frequency of the local oscillation signal supplied to the first mixer is switched, depending on a relative position of the adjacent signal and the received signal, between a frequency which is higher than a first intermediate frequency and a frequency which is lower than the same. Alternatively, a sign of the frequency offset in the second quadrature mixer may be switched depending on a relative position of the adjacent signal and the received signal.

BRIEF DESCRIPTION OF THE DRAWINGS

FIG. 7 is a block diagram showing a structure of a receiving apparatus in Embodiment 1 of the present invention;

FIG. 12 is a block diagram showing a structure of the receiving apparatus of Embodiment 2 of the present invention;

FIG. 15 is a block diagram showing a structural example of NCO used in the receiving apparatus of Embodiment 2;

DETAILED DESCRIPTION OF THE PREFERRED EMBODIMENTS

Figure 1:
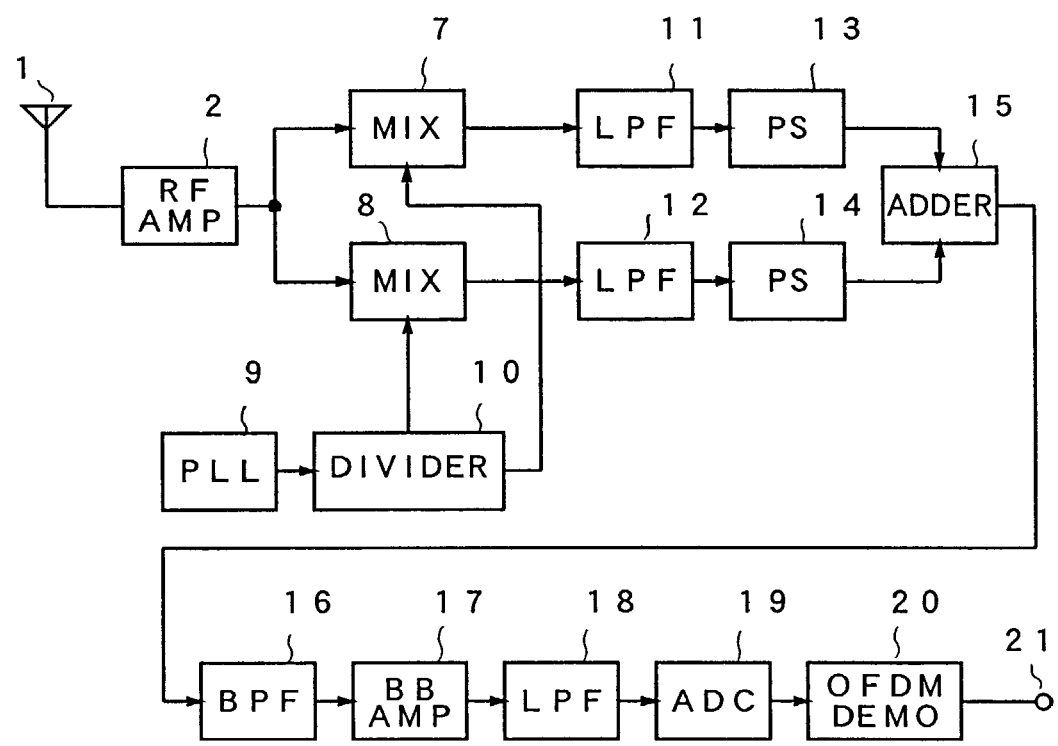
FIG. 1 is a block diagram showing a structure of receiving apparatus of a first conventional example.
Figure 2:
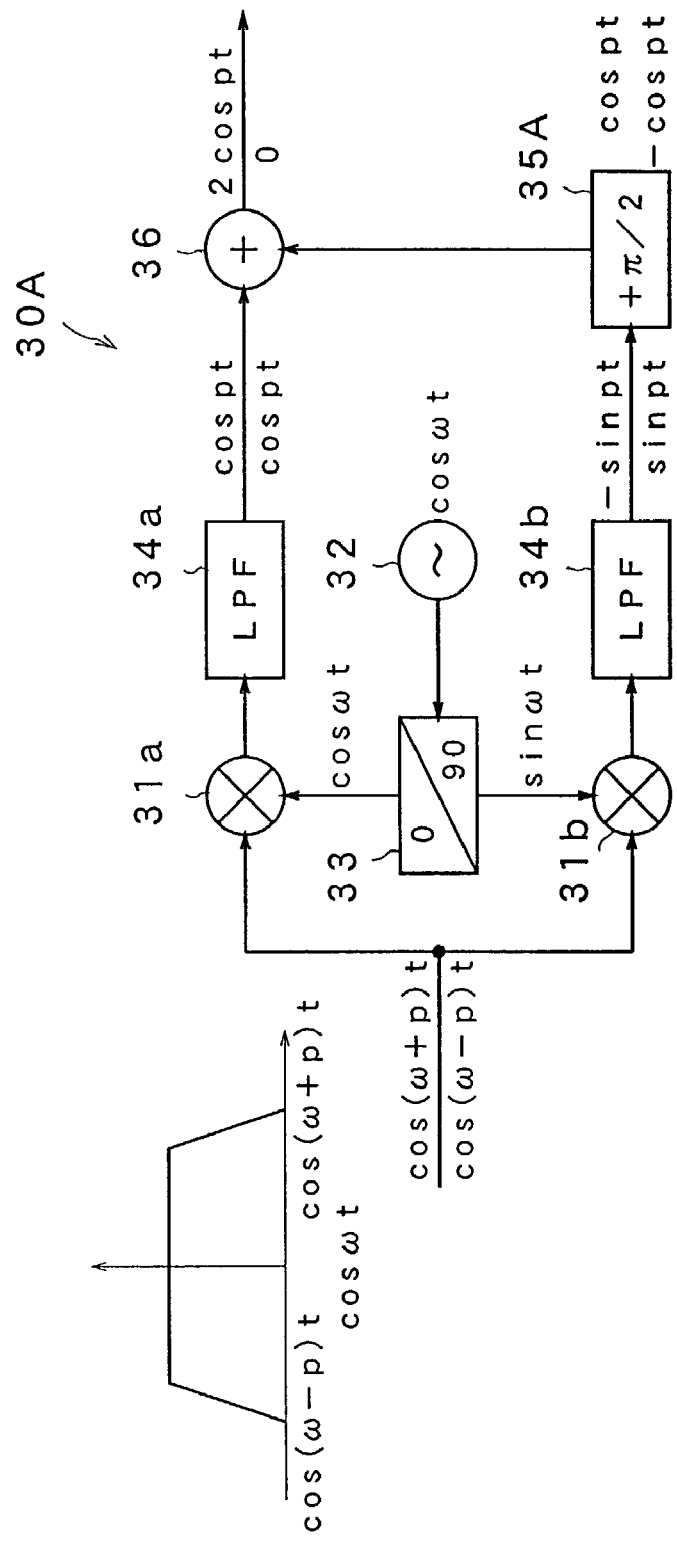
FIG. 2 is a functional block diagram of an image rejection mixer (canceling a lower side band)
Figure 3:
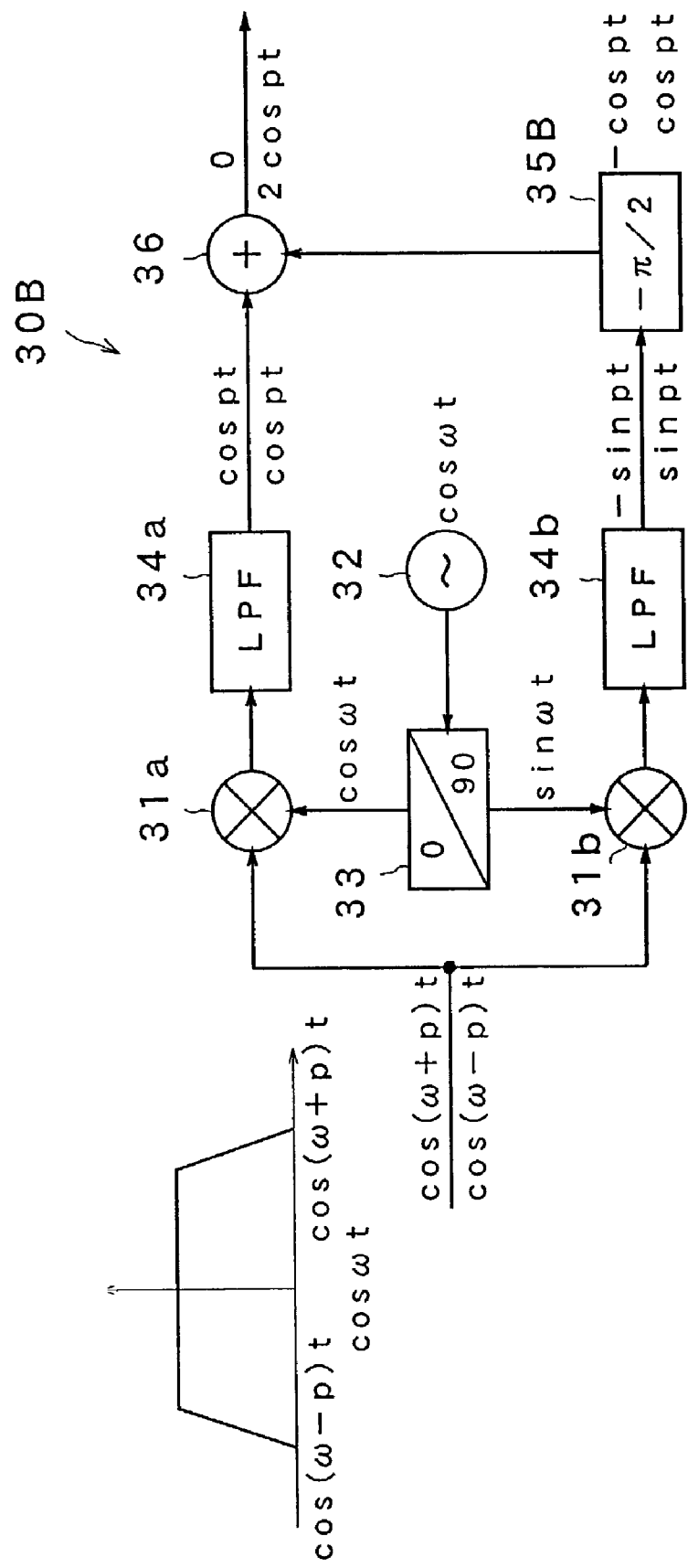
FIG. 3 is a functional block diagram of an image rejection mixer (canceling an upper side band)
Figure 4A:
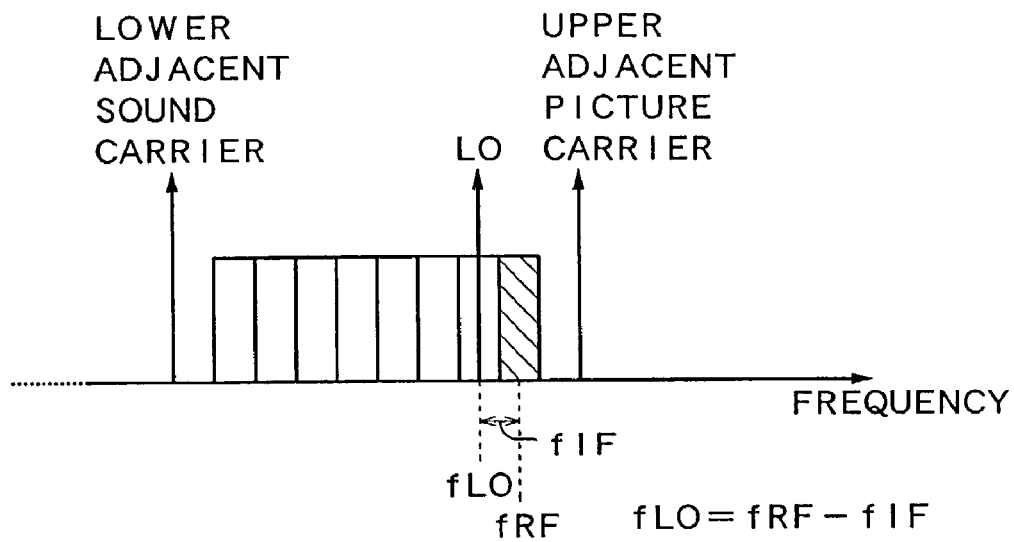
FIG. 4A is a spectral diagram when an upper segment is received in a conventional receiving apparatus.
Figure 4B:
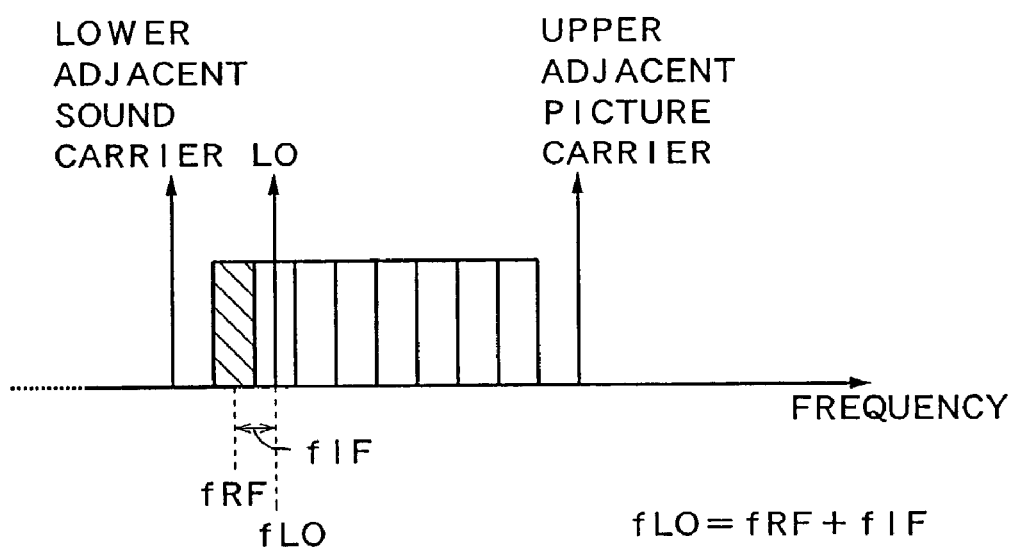
FIG. 4B is a spectral diagram when a lower segment is received in a conventional receiving apparatus.
Figure 5:
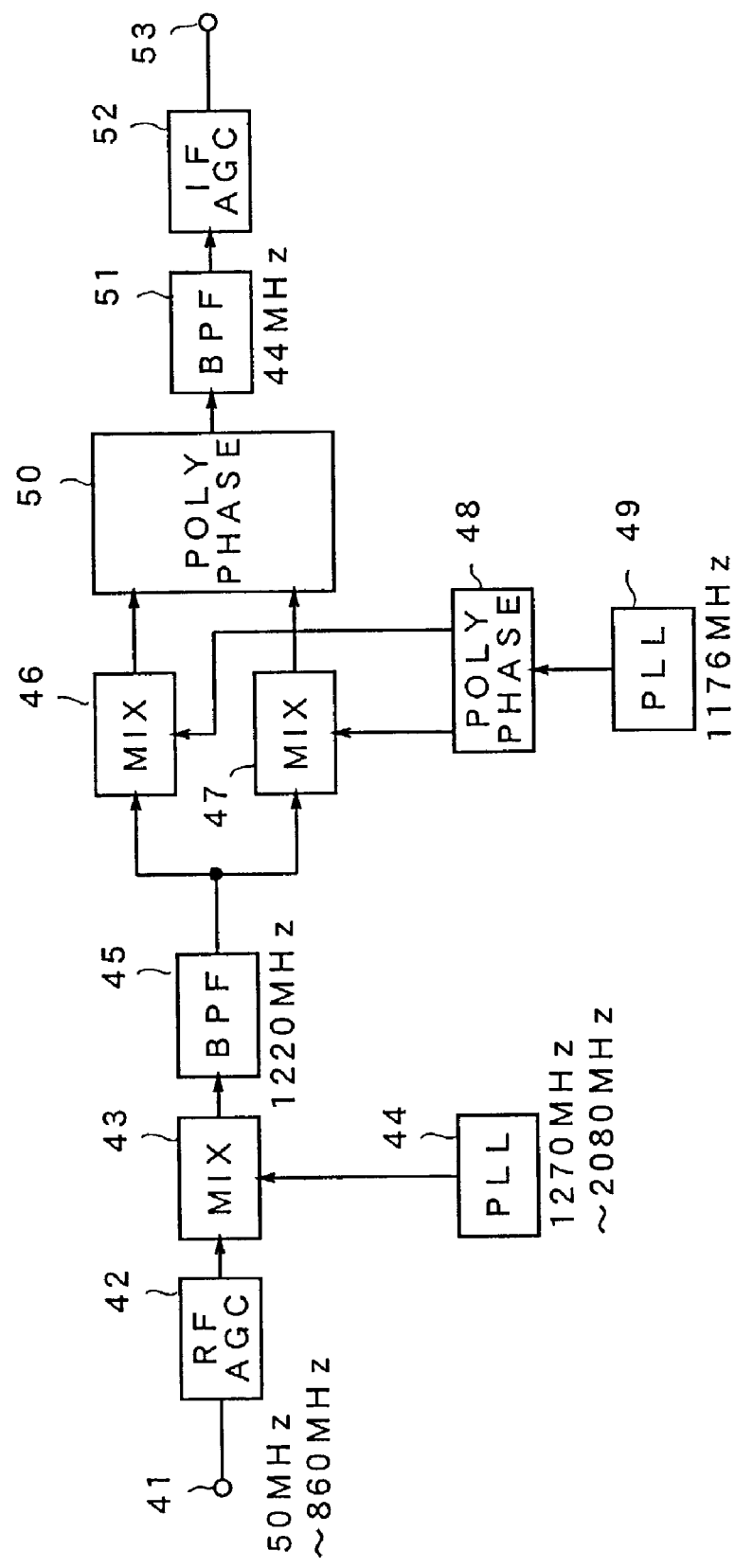
FIG. 5 is a block diagram showing a structure of a receiving apparatus of a second conventional example.
Figure 6A:
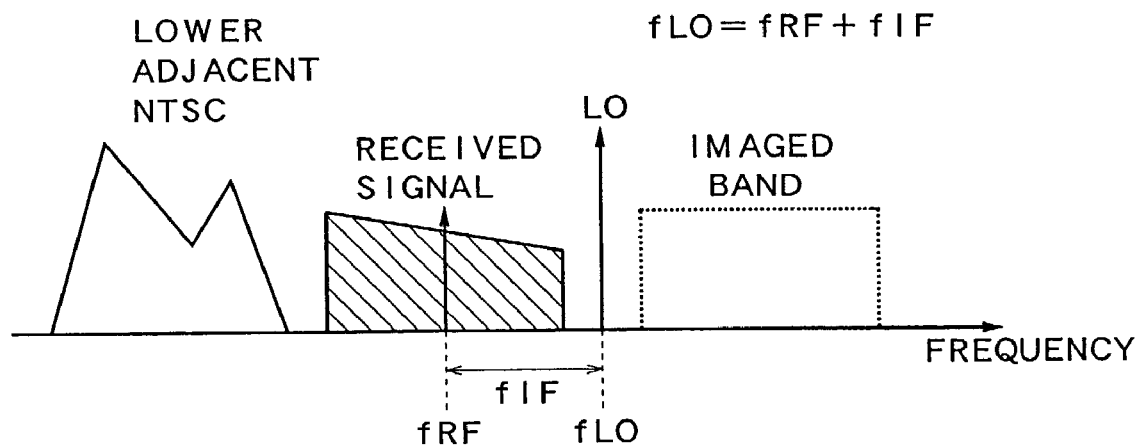
FIG. 6A is a spectral diagram when a lower adjacent signal exists in a receiving apparatus of the conventional example.
Figure 6B:
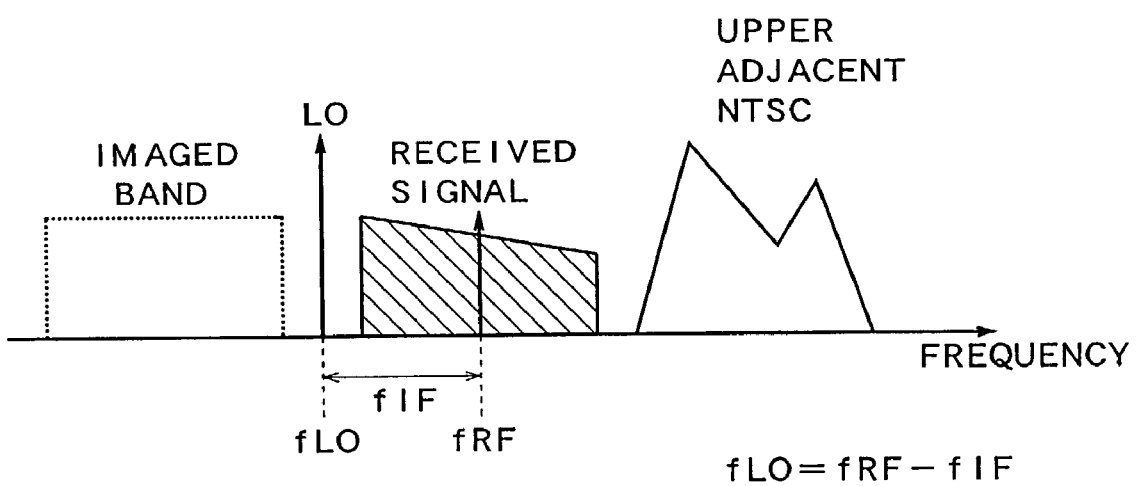
FIG. 6B is the spectral diagram when an upper adjacent signal exists in the receiving apparatus of the conventional example.

A receiving apparatus according to embodiments of the present invention will be described hereinafter with reference to the drawings.

Embodiment 1

FIG. 7 is a block diagram of a receiving apparatus 60 according to Embodiment 1 of the present invention. The receiving apparatus 60 is a receiving apparatus which performs partial reception, i.e., receives one segment. The receiving apparatus 60 is configured so as to include an antenna 61, an RF amplifier 62, a mixer 63, a PLL 64, a BPF 65, an IF amplifier 66, mixers 67 and 68, a PLL 69, a phase shifter 70, low pass filters (LPF) 71 and 72, phase shifters 73 and 74, an adder 75, a band pass filter (BPF) 76, a base band amplifier (BB amplifier) 77, an LPF 78, an AD converter (ADC) 79, an OFDM demodulator 80, a transport stream output terminal (TS output terminal) 81 and a control section 82.

The RF amplifier 62 is an amplifier which amplifies an RF signal including an ISDB-T signal received by the antenna 61. The mixer 63 is a circuit for converting a frequency into a first intermediate frequency fIF1 using an oscillation signal (local oscillator frequency fLO1) outputted from the PLL 64. The BPF 65 is a filter to which an output signal of the mixer 63 is inputted and which selects only a band portion of the received segment and passes the same, and attenuates signals of other segments or adjacent channels.

The IF amplifier 66 has a function of amplifying IF signal inputted from the BPF 65. The mixers 67 and 68, the PLL 69 and the phase shifter 70 have a function of quadrature mixer described above and serve as a circuit for performing frequency conversion for a signal outputted from the IF amplifier 66 using a second local oscillator frequency fLO2. The LPF 71 and 72 are analog low pass filters for removing band components equal to or higher than a received segment in a base band frequency band outputted from the mixers 67 and 68. Local oscillator frequencies at the PLL 64 and 69 are controlled by the control section 82.

The phase shifters 73 and 74 are circuits for respectively controlling phases of the output signals of the LPF 71 and 72. The phase shifter 73 phase-shifts an input signal by $\phi$. The phase shifter 74 phase-shifts an input signal by ($\phi$+90°). The adder 75 is a circuit for adding signals outputted from the phase shifters 73 and 74 and removing frequency components of the upper side band or the lower side band. The BPF 76 is a filter which passes only the second intermediate frequency fIF2 of the base band stage. The BB amplifier 77 is an amplifier which amplifies a base band signal. The LPF 78 is a low pass filter for removing in advance an alias at the ADC 79. The ADC is a circuit for converting the analog input signal to a digital signal with a sampling clock. The OFDM demodulator 80 is a circuit which performs demodulation processes such as complex Fourier transform, frequency deinterleave, time deinterleave and error correction in accordance with a modulation process at a time of sending an ISDB-T.

An operation of the receiving apparatus 60 with such structure will be described. An ISDB-T signal received by the antenna 61 is amplified by the RF amplifier 62 and the resultant amplified signal is inputted to the mixer 63. The PLL 64 generates a local oscillation signal with predetermined frequency by instruction of the control section 82 and supplies the local oscillation signal to the mixer 63. The mixer 63 mixes an output signal of the RF amplifier 62 with the local oscillation signal of the PLL 64 so as to convert a frequency into a first intermediate frequency fIF1. The frequency fIF1 is a fixed frequency.

Figure 8A:
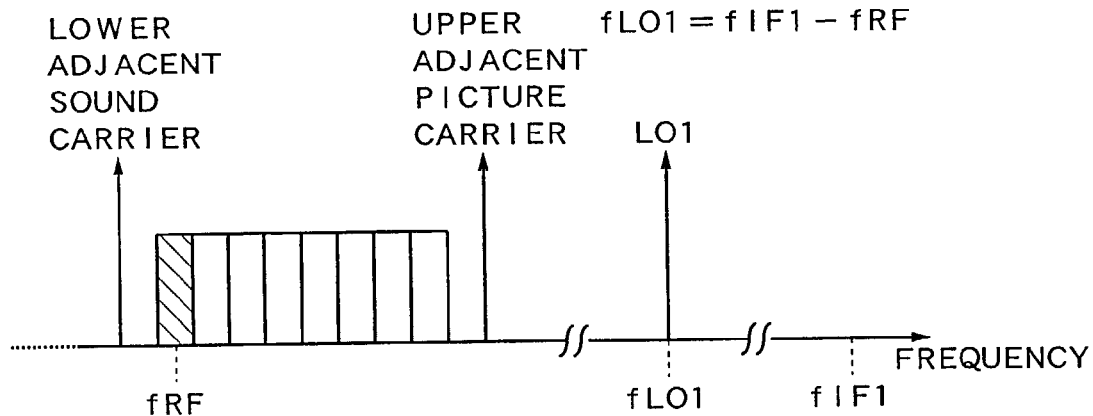
FIG. 8A is a spectral diagram showing an RF output including a lower segment in the receiving apparatus of Embodiment 1.
Figure 8B:
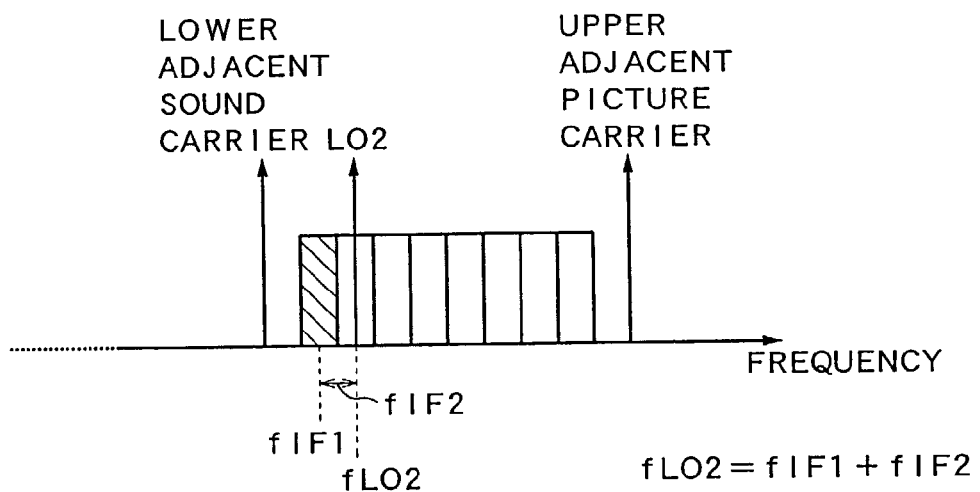
FIG. 8B is a spectral diagram showing an IF output including a lower segment in the receiving apparatus of Embodiment 1.
Figure 8C:
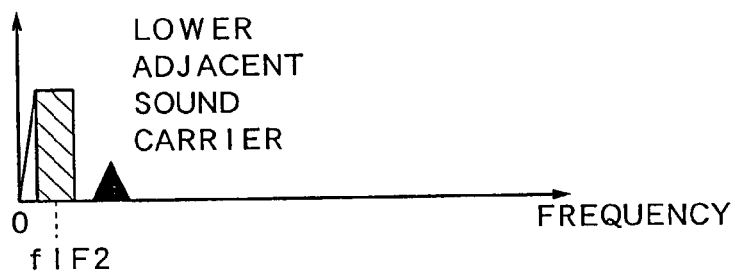
FIG. 8C is a spectral diagram showing a BB output including a lower segment in the receiving apparatus of Embodiment 1.

Setting of the frequency of the PLL 64 will be described. As described above, in digital terrestrial sound broadcasting, any one segment is selected and reception demodulation is performed. FIGS. 8A to 8C are frequency spectral diagrams when eight segments are successively sent and a segment at the lowest frequency position is received. The portion shown by hatching is the corresponding segment.

As shown in FIG. 8A, the control section 82 sets a local oscillator frequency fLO1 of the PLL 64 in accordance with a received frequency so as to satisfy the frequency relationship fLO1=fIF1−fRF. The local oscillator frequency fLO1 is lower than the first intermediate frequency fIF1. The frequency of fRF is a center frequency of the received segment.

In a case of digital terrestrial sound broadcasting, it is restricted to a VHF band. Accordingly, fRF is in the range of 90 MHz to 222 MHz. In general, the intermediate frequency fIF1 is determined so as to exclude a received band. In a case of the receiving apparatus 60, the whole VHF and UHF serves as a received band and its frequency band is 90 MHz to 770 MHz. For example, assume that the first intermediate frequency fIF1=1400 MHz. Thus, when a signal with fRF=90 MHz to 222 MHz is to be received, the local oscillator frequency is fLO1=1178 MHz to 1310 MHz.

The up-and-down relationship of the frequency spectrum of the input to the mixer 63 is maintained at an output side of the mixer 63. Thus, an IF output of the mixer 63 is shown in FIG. 8B. The received segment is still positioned, as shown by hatchings, at the lowest frequency. In both of cases of successively sending 8 segments and 12 segments, when a segment with the lowest or the second lowest frequency in the received signal is to be received, frequency conversion is performed by using the frequency relationship fLO1=fIF1−fRF.

Figure 9A:
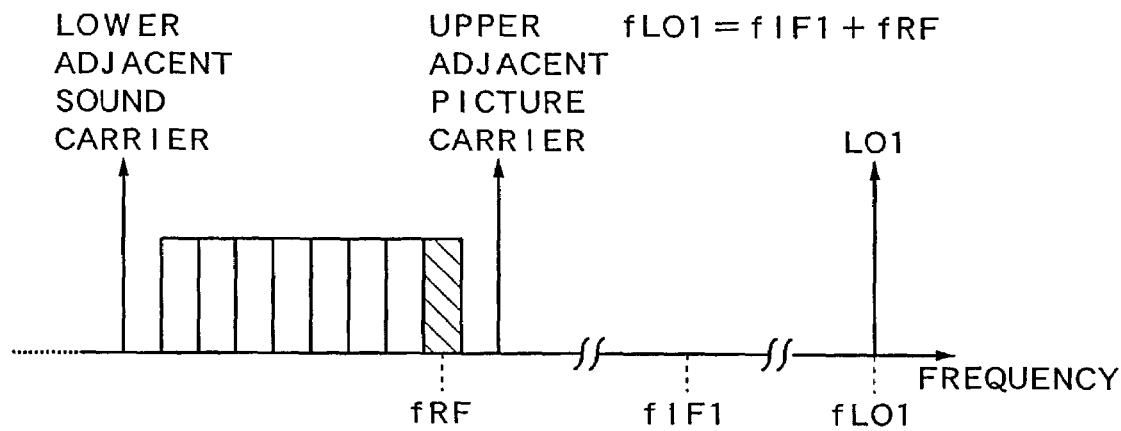
FIG. 9A is a spectral diagram showing an RF output including an upper segment in the receiving apparatus of Embodiment 1.
Figure 9B:
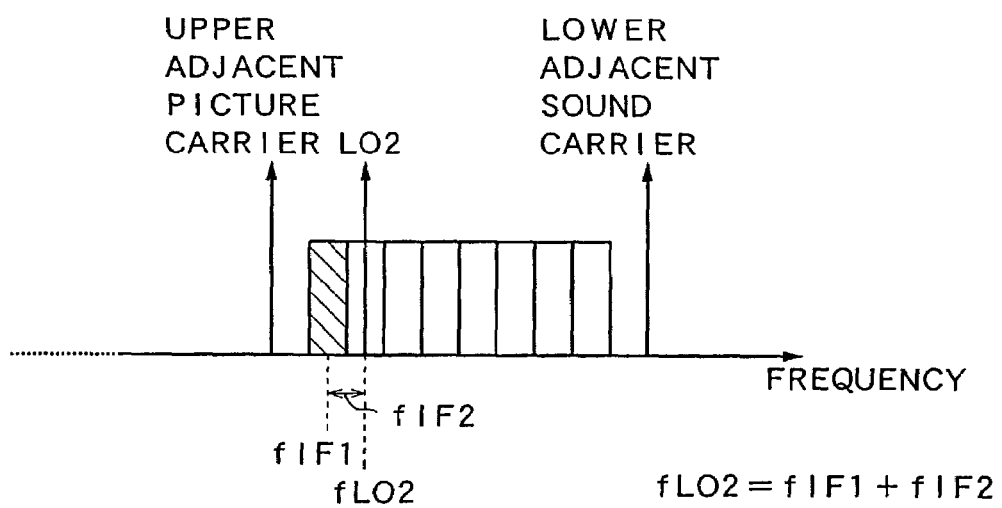
FIG. 9B is a spectral diagram showing an IF output including an upper segment in the receiving apparatus of Embodiment 1.
Figure 9C:
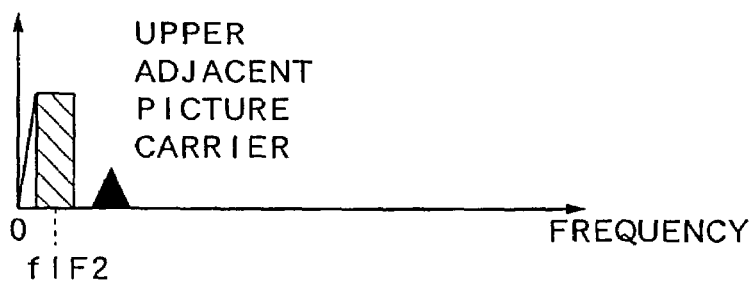
FIG. 9C is a spectral diagram showing a BB output including an upper segment in the receiving apparatus of Embodiment 1.

On the other hand, referring to FIGS. 9A to 9C, eight segments are successively sent and a segment positioned at the highest frequency is to be received. A portion shown by hatching in FIG. 9 is a corresponding segment. As shown in FIG. 9A, the local oscillator frequency fLO1 of the PLL 64 is set in accordance with a received frequency so as to satisfy the frequency relationship fLO1=fIF1+fRF. Different from cases of FIGS. 8A to 8C, the local oscillator frequency fLO1 is higher than the intermediate frequency fIF1. If fIF1 is set to 1400 MHz as in FIGS. 8A to 8C, the local oscillator frequency fLO1 is 1490 MHz to 1622 MHz when a signal with fRF=90 MHz to 222 MHz is to be received.

Since the up-and-down relationship of frequency spectrum of the input to the mixer 63 is upside down at an output side of the mixer 63, an output of the mixer 63 is shown in Fig. 9B. A received segment is, as shown by hatching in FIG. 9B, at the lowest frequency position. In both of the cases of successively sending 8 segments and 12 segments, when a segment with the highest frequency or the second highest frequency is to be received, frequency conversion is performed by using the frequency relationship fLO1=fIF1+fRF. When segments with the third lowest frequency and subsequent frequencies or the third highest frequency and subsequent frequencies are to be received, the frequency relationship fLO1=fIF1−fRF shown in FIGS. 8A to 8C may be used or the frequency relationship fLO1=fIF1+fRF shown in FIG. 9A to 9C may be used. In a case of partial reception of UHF digital terrestrial TV broadcasting, among 13 segments, one segment serving as a central segment is received. For this reason, the local oscillator frequency fLO1 may be set by using either of the relationships in accordance with such conditions.

FIGS. 8A and 9A are spectral diagrams in a case in which an NTSC signal of an analog TV exists at upper and lower adjacent channels of the received signal. similarly, referring to FIGS. 8B and 9B, an NTSC signal of the analog TV is indicated at upper and lower adjacent channels when converted into the intermediate frequency fIF1.

The BPF 65 shown in FIG. 7 has an output signal of the mixer 63 inputted, selects only a segment to be received, passes the same and attenuates other segments or signals of adjacent channels. A center frequency of the BPF 65 is 1400 MHz and a width of passband is equal to or wider than one segment. The IF amplifier 66 amplifies a signal outputted from the BPF 65. The signal outputted from the IF amplifier 66 is inputted to a quadrature mixer formed by the PLL 69, mixers 67, 68 and the phase shifter 70.

The mixer 68 performs frequency conversion by using an oscillation signal LO2 (frequency: fLO2) of the PLL 69. The mixer 67 performs frequency conversion with a signal obtained by phase-shifting the oscillation signal LO2 of the PLL 69 by 90° at the phase shifter 70. The phase shifter 70 only maintains quadrature precision at a single frequency. Thus, this can be realized by a 90° phase shifter. As shown in the conventional example, 90° may be obtained by using a divider. Nevertheless, in accordance with a case of using the divider, the oscillation frequency of the PLL 69 must be set so as to be twice or four times larger than 1400 MHz, so that a frequency becomes high. For this reason, there arise problems in that an oscillator or a divider is hardly realized and power consumption becomes high.

Outputs of the mixers 67 and 68 become signals of the second intermediate frequency fIF2. If the second intermediate frequency fIF2 is set, for example, at 500 kHz as in the conventional example, the control section 82 sets an oscillation frequency fLO2 to be fLO2=fIF1+fIF2=1400.5 MHz. This frequency is a fixed value. A set value of the local oscillator frequency fLO2 in FIGS. 8A to 8C is the same as that of FIGS. 9A to 9C and does not depend on a position of the received segment. A circuit formed by the mixers 67, 68, the phase shifter 70, the LPF 71, 72, the phase shifters 73, 74 and the adder 75 shown in FIG. 7 is referred to as an image rejection mixer. By using the image rejection mixer, an image band to be removed needs not to be switched, depending on a position of the received segment, to be higher or lower than the local oscillator frequency LO2. Accordingly, positions of the phase shifters 73 and 74 need not be switched and an amount of phase shift also need not be switched. As a result, a function of image suppression with high precision can be realized.

FIGS. 8C and 9C show spectral diagrams in the second intermediate frequency fIF2 at a base band stage in which an output of BPF 76, or an input of BB amplifier 77 is indicated. As shown in these maps, among frequency components between a received segment and the oscillation signal LO2, a frequency component that cannot be removed by the BPF 76 remains at DC. Similarly, at the high band side of the received segment, an adjacent NTSC signal component that cannot be removed by the BPF 76 remains. When the lower end or the upper end segment of the received signal is received, it is assumed that the adjacent NTSC signal cannot be sufficiently suppressed by the BPF 76. In this case, a folding noise may be generated at a time of sampling at the ADC 79 and the aliasing noise may enter within the band. In order to avoid such a drawback, it is also effective to change a sampling frequency of the ADC 79 to an optimum value in accordance with a position of the received segment. In general, it is advantageous to set a sampling frequency as low as possible in view of reducing power consumption of the A/D converter. When interference caused by the aliasing noise occurs, a sampling frequency is set such that the interference does not enter within the band.

A spectral polarity of the received segment shown in FIG. 8C is inverted from that of FIG. 9C. In a digital signal processing within the OFDM demodulator 80, a sign of one of signal I with a real axis and signal Q with an imaginary axis subsequent to quadrature detection may be inverted. Alternatively, the signal I may be changed to the signal Q. Further, the up-and-down relationship of the spectrum subjected to the FFT process may be rearranged. In this way, correction can be performed.

An output of the ADC 79 is inputted to the OFDM demodulator 80. The OFDM demodulator 80 demodulation processes include complex Fourier transform, frequency deinterleave, time deinterleave and error correction in accordance with the modulation process at a time of sending an ISDB-T. A result of demodulation is outputted to the TS output terminal 81 as a transport stream (TS). A subsequent back end (not shown) reproduces a video and an audio signal by decoding the TS.

As described above, in accordance with the receiving apparatus of this embodiment, a received signal is converted into a first intermediate frequency fIF1 at a time of frequency conversion by the mixer 63. Thus, an image rejection mixer including the mixers 67 and 68 can be operated at a single frequency. For this reason, reception of wide-band from VHF to UHF can be performed. A local oscillator frequency fLO1 inputted to the mixer 63 is switched between an upper side of the first intermediate frequency and a lower side thereof depending on a position of the received segment. Thus, an image band to be removed by the image rejection mixer can be fixed. For this reason, phase shifters need not be switched and an image rejection performance can be ensured with high precision.

The RF amplifier 62 may be formed by an AGC amplifier and AGC control can be performed by measuring received power at an output of the mixer 63. In this case, AGC control can be performed at power including an adjacent signal. Thus, when an adjacent interfering signal with larger power than a received signal exists, generation of non-linear distortion at the RF amplifier 62 and the mixer 63 can be prevented. Similarly, the IF amplifier 66 may be formed by an AGC amplifier and AGC control can be performed by measuring power at an output of the adder 75. In this case the AGC control is possible at power including an adjacent signal that cannot be removed by the BPF 65. Thus, generation of non-linear distortion at the IF amplifier 66 and the mixers 67 and 68 can be prevented. The BB amplifier 77 can be controlled by the OFDM demodulator 80.

At an output of the BPF 76, an adjacent signal component is sufficiently suppressed and only a desired signal is provided. For this reason, the BB amplifier 77 is operated so as to correct power of the desired received signal that is suppressed by the RF amplifier 62 or the IF amplifier 66 to a level appropriate for inputting to the ADC 79 when an adjacent interfering signal is large. When the antenna 61 is configured so as to control tuning frequency by a control voltage, the antenna 61 may be used as AGC at the first stage of the RF. For example, when an input level of the RF amplifier 62 exceeds a determined level when monitoring the control voltage of the RF amplifier 62, an input level of the RF amplifier 62 can be controlled so as to be within a determined value by shifting tuning of the antenna 61.

A bandwidth of the BPF 65 is narrow, i.e., about one segment at minimum. Nevertheless, when it is difficult to realize a narrow band pass filter, a wide-band of e.g., around 6 MHz is provided. A received RF signal corresponding to one channel may be subjected to group conversion into the first intermediate frequency by using the frequency relationship fLO1=fIF1−fRF shown in FIGS. 8A to 8C or the frequency relationship fLO1=fIF1+fRF shown in FIGS. 9A to 9C. At this case, each of the segments can be selected by switching a frequency of the local oscillation signal LO2 for each received segment. Alternatively, a frequency fLO1 of the oscillation signal LO1 is changed for each received segment. The intermediate frequency fIF1 may be adjusted such that an adjacent interfering signal overlaps a cut-off frequency of the BPF 65. In this case, performance of removing an adjacent signal can be ensured even if the BPF 65 has a wide-band.

Above-described values of intermediate frequency such as fIF1=1400 MHz and fIF2=500 kHz are only examples and are not limited to such frequencies. A description has been made that an image rejection mixer is operated so as to always remove a band higher than the oscillation signal LO2. At the mixer 63, the frequency relationship shown in FIGS. 8A to 8C may be changed to the frequency relationship shown in FIGS. 9A to 9C. In this case, a band which is lower than the oscillation signal LO2 is always removed.

An example of an application of the receiving apparatus according to Embodiment 1 will be described.

FIGS. 10A to 10C and 11A to 11C are spectral diagrams in which the function of the receiving apparatus of Embodiment 1 is applied to reception of all of the thirteen segments of the ISDB-T for digital terrestrial TV broadcasting or the OFDM signal such as DVB-T or the like. In order to easily understand a spectral polarity of the received signal before and after frequency conversion, an intentionally tapered frequency characteristic is shown. This receiving apparatus is the same as that of FIG. 7 except that the LPF 71 and 72, the phase shifters 73, 74, the BPF 76 and the LPF 78 are configured so as to have a wide-band and a sampling frequency of the ADC 79 is set to be high.

Figure 10A:
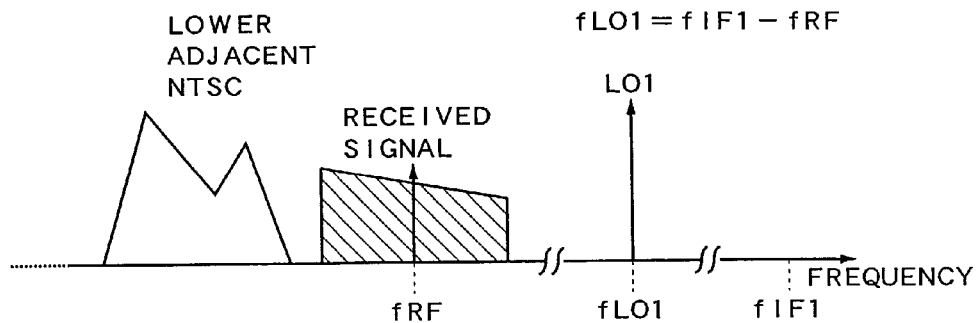
FIG. 10A is a spectral diagram showing an RF output in a receiving apparatus of Embodiment 1 (application example 1)
Figure 10B:
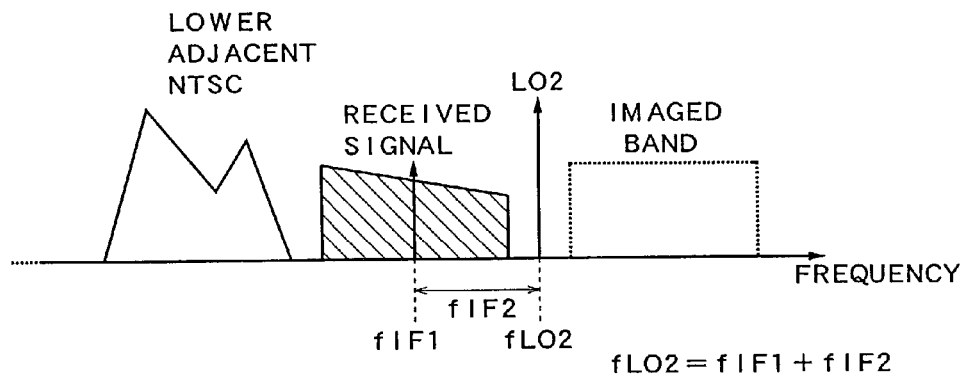
FIG. 10B is a spectral diagram showing an IF output in the receiving apparatus of Embodiment 1 (application example 1)
Figure 10C:
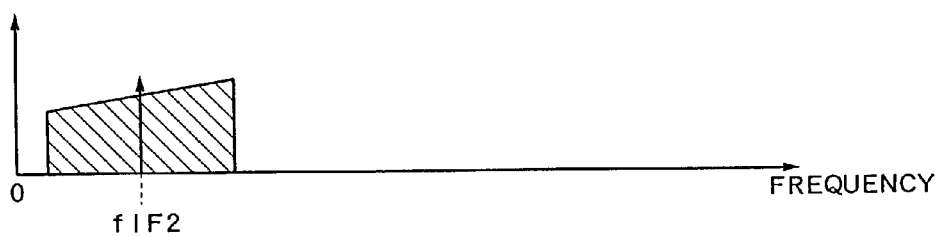
FIG. 10C is a spectral diagram showing a BB output in the receiving apparatus of Embodiment 1 (application example 1)
Figure 11A:
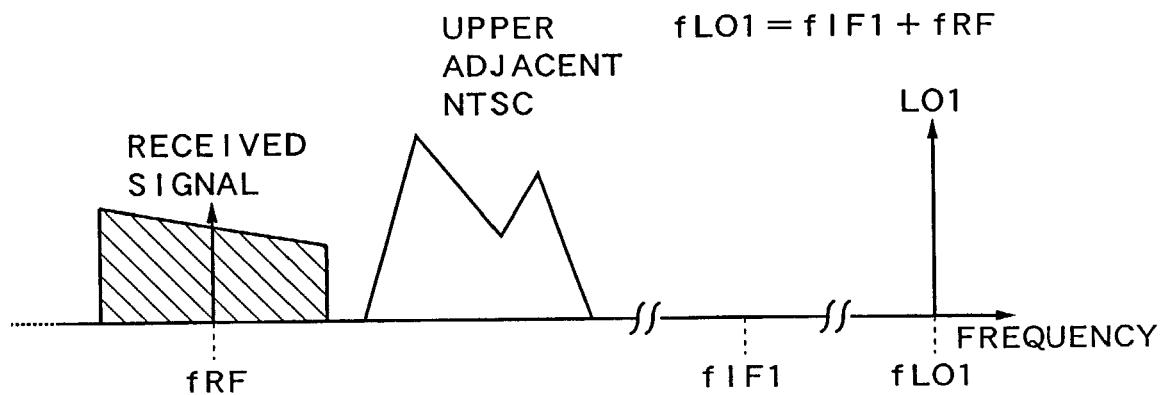
FIG. 11A is a spectral diagram showing an RF output in a receiving apparatus of Embodiment 1 (application example 2)
Figure 11B:
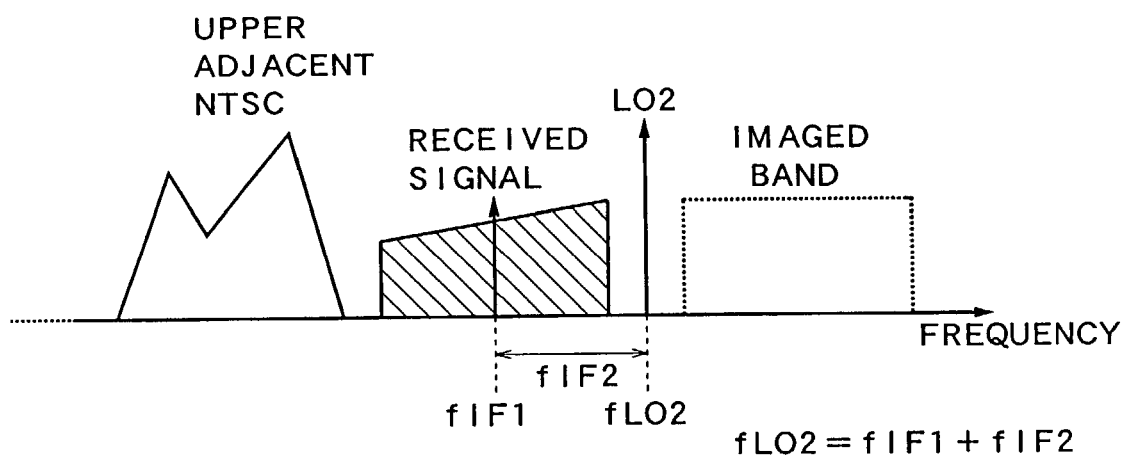
FIG. 11B is a spectral diagram showing an IF output in the receiving apparatus of Embodiment 1 (application example 2)

FIGS. 10A to 10C are spectral diagrams when a lower adjacent NTSC signal exists. As an example, a first intermediate frequency is fIF1=1400 MHz and a center frequency of the received signal varies in a range of fRF=470 to 770 MHz. As shown in FIG. 10A, when a lower adjacent interfering signal exists, a local oscillation frequency fLO1 indicated by Lower LO is 630 to 930 MHz by fLO1=fIF1−fRF. As shown in FIG. 11A, when an upper adjacent interfering signal exists, a local oscillator frequency fLO1 indicated by Upper LO is 1870 to 2170 MHz by fLO1=fIF1+fRF.

Figure 11C:
FIG. 11C is a spectral diagram showing a BB output in the receiving apparatus of Embodiment 1 (application example 2)

An operation of the image rejection mixer in the first intermediate frequency fIF1 is always functioned with fLO2=1404 MHz by an instruction for switching the local oscillator frequency fLO1 by the control section 82, in cases of upper and lower adjacent interfering signals. Such a state is shown by the spectral diagrams in FIGS. 10B and 11B. As an output of the image rejection mixer including the mixers 67 and 68, a base band output with the second intermediate frequency fIFf2=4 MHz can be obtained. Such state is shown in FIGS. 10C and 11C. Here, fIF2=4 MHz is an example.

As seen from a comparison of FIGS. 10C and 11C, a spectral polarity of the received signal of FIG. 10C is inverted from that of FIG. 11C. Thus, in a digital signal processing performed within the OFDM demodulator 80, one of the signs of signal I with a real axis and signal Q with an imaginary axis subsequent to quadrature detection may be inverted or I may be changed to Q. Alternatively, the up-and-down relationship of the spectrum subjected to FFT process may be rearranged. In these ways, correction is performed. When the relationship between an upper and lower adjacent interfering signal and a polarity of the local oscillator frequency fLO1 is inverted from the above description, the local oscillator frequency fLO2 is determined as 1396 MHz so as to be lower than the first intermediate frequency f1F1.

As a method of detecting an existence of an adjacent interfering signal, there has been provided a method of detecting upper and lower adjacent signal components from the results of performing FFT for a received signal at the OFDM demodulator 80. Alternatively, when a bit error rate of the received signal subjected to demodulation or a receiving C/N is inferior, there is provided a method of switching a polarity of the local oscillator frequency fLO1.

As described above, in accordance with the receiving apparatus of this embodiment, the control section 82 searches the presence or absence of the upper or lower adjacent interfering signal and the local oscillator frequency fLO1 inputted to the mixer 63 is switched between a frequency higher than the first intermediate frequency and a frequency lower than the same. Thus, an image band to be removed by the image rejection mixer including the mixers 67 and 68 can be fixed. For this reason, switching of the phase shifter is not required and an image rejection performance can be ensured with high precision. At the same time, an adjacent interfering signal can be removed from the image band, so that a degree of selection can be improved. Here, effect of this system cannot be obtained if both of the upper and lower adjacent interfering signals exist. This application example can be applied to modulation systems other than OFDM, i.e., reception of a digital modulation signal such as QPSK, QAM and VSB.

Embodiment 2

A receiving apparatus according to Embodiment 2 of the present invention will be described. FIG. 12 is a block diagram showing a structure of a receiving apparatus 90 of this embodiment. The same portions as those of the receiving apparatus 60 of Embodiment 1 shown in FIG. 7 are indicated by the same reference numerals and a detailed description thereof will not be repeated. The receiving apparatus 90 is configured so as to include an antenna 61, an RF amplifier 62, a mixer 63, a PLL 64, a BPF 65, an IF amplifier 66, mixers 67, 68, a PLL 69, a phase shifter 70, low pass filters (LPF) 71, 72, base band amplifiers (BB amplifiers) 201, 202, AD converters (ADC) 91, 92, a complex multiplier 93, a numerical control oscillator (NCO) 94, digital LPF 95, 96, an OFDM demodulator 97, a transport stream output terminal (TS output terminal) 98 and a control section 99.

The ADC 91 is a circuit for converting an analog I signal outputted from the BB amplifier 201 into a digital signal. The ADC 92 is a circuit for converting an analog Q signal outputted from the BB amplifier 202 into a digital signal. The complex multiplier 93 is a circuit for complex multiplying I and Q signals outputted from the ADC 91 and 92 by using a complex wave outputted from the NCO 94. The LPF 95 is a digital filter which cuts-off a high band component of the I signal outputted from the complex multiplier 93. The LPF 96 is a digital filter which cuts-off a high band component of the Q signal outputted from the complex multiplier 93. The OFDM demodulator 97 is a circuit which performs a demodulation process including complex Fourier transform, frequency deinterleave, time deinterleave and error correction. The control section 99 supplies a control signal having a local oscillator frequency to the PLL 64, 69 and sends a frequency offset signal to the NCO 94.

For an operation of the receiving apparatus 90 with such structure, a case of partially receiving one segment will be described. An ISDB-T signal received by the antenna 61 is amplified by the RF amplifier 62 and a resultant amplified signal is inputted to the mixer 63. The control section 99 sends a signal to the PLL 64 to generate an oscillation signal with a predetermined frequency. The PLL 64 supplies an instructed local oscillation signal to the mixer 63. The mixer 63 converts the frequency into the first intermediate frequency fIF1 for an inputted signal. The intermediate frequency fIF1 is a fixed frequency.

Setting of the frequency of the PLL 64 will be described. As described, above, in digital terrestrial sound broadcasting, any one segment is selected and reception demodulation is performed for the segment. FIGS. 13A to 13D are spectral diagrams in which eight segments are successively sent and an analog NTSC signal exists at upper and lower adjacent channels. Assume that the segment with hatching shown in FIG. 13A, i.e., a segment at the lowest frequency position, is received. The control section 99 sets a local oscillator frequency of the PLL 64 depending on a received frequency fRF so as to satisfy a frequency relationship fLO1=fIF1+fRF with respect to the local oscillator frequency fLO1. Here, the Upper LO frequency relationship is provided, i.e., the local oscillator frequency fLO1 is higher than the intermediate frequency fIF1. The frequency fRF is a center frequency of received the segment.

Since the digital terrestrial sound broadcasting band is limited to a VHF band, a received frequency fRF is in a range from 90 MHz to 222 MHz. In general, the intermediate frequency fIF1 is set outside the received band. The receiving apparatus 90 receiving any band within the whole VHF and UHF, a received band is in a range of 90 MHz to 770 MHz. For example, a first intermediate frequency fIF1=1400 MHz. Accordingly, when a signal of fRF=90 MHz to 222 MHz is received, the first local oscillator frequency fLO1 is in a range of 1490 MHz to 1622 MHz. At the output side of the mixer 63, the frequency spectrum is reversed from the input spectrum. Thus, an output of the mixer 63 is shown in FIG. 13B. The received segment is upside down and placed at the highest frequency position.

In both of the cases of successively sending eight segments and twelve segments, when a segment at any position is received, frequency conversion is performed so as to satisfy the frequency relationship fLO1=fIF1+fRF.

Figure 14A:
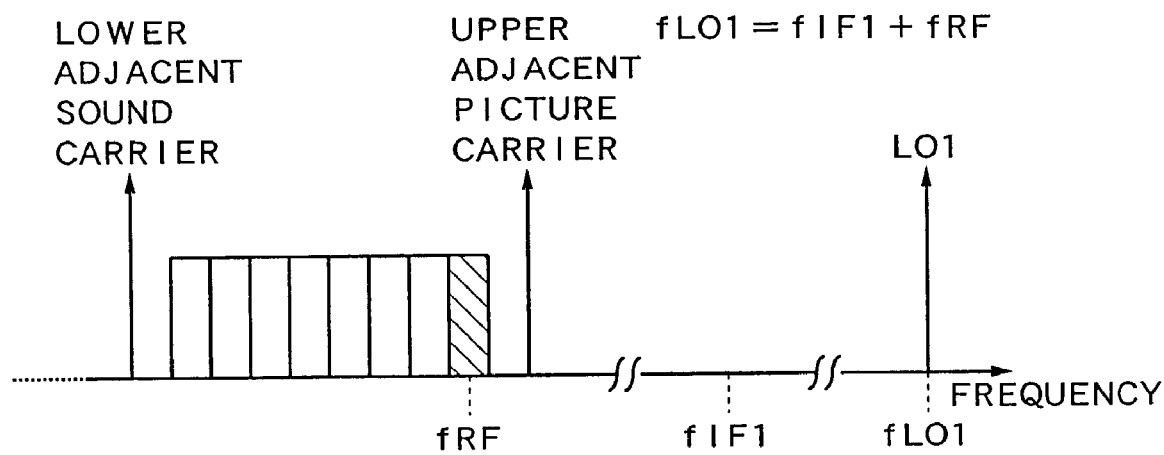
FIG. 14A is a spectral diagram showing an RF output in a receiving apparatus of Embodiment 2 (operation 2)
Figure 14B:
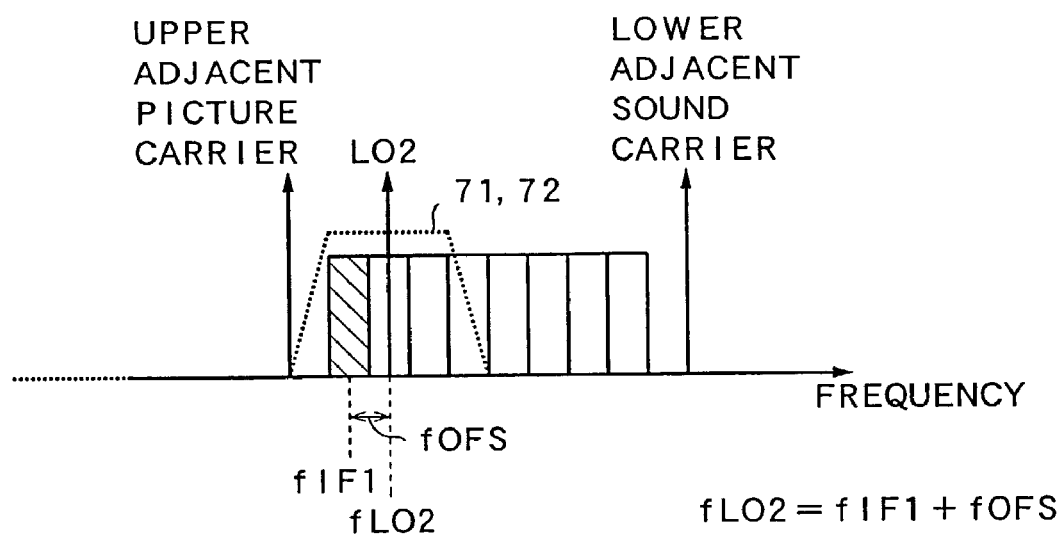
FIG. 14B is a spectral diagram showing an IF output in the receiving apparatus of Embodiment 2 (operation 2)

As another example, spectral diagrams shown in FIGS. 14A to 14D are given. FIGS. 14A to 14D are spectral diagrams in which eight segments are successively sent and a segment at the highest frequency position, i.e., a segment shown by hatching in FIG. 14A is received. Similarly, at the output side of the mixer 63, the frequency spectrum of the input of the mixer 63 is inverted. As a result, an output of the mixer 63 is shown in FIG. 14B. The received segment comes at the lowest frequency position. Similarly, when partial reception is performed for UHF digital terrestrial TV broadcasting, the local oscillator frequency fLO1 is set so as to satisfy the relationship fLO1=fIF1+fRF.

Figure 13A:
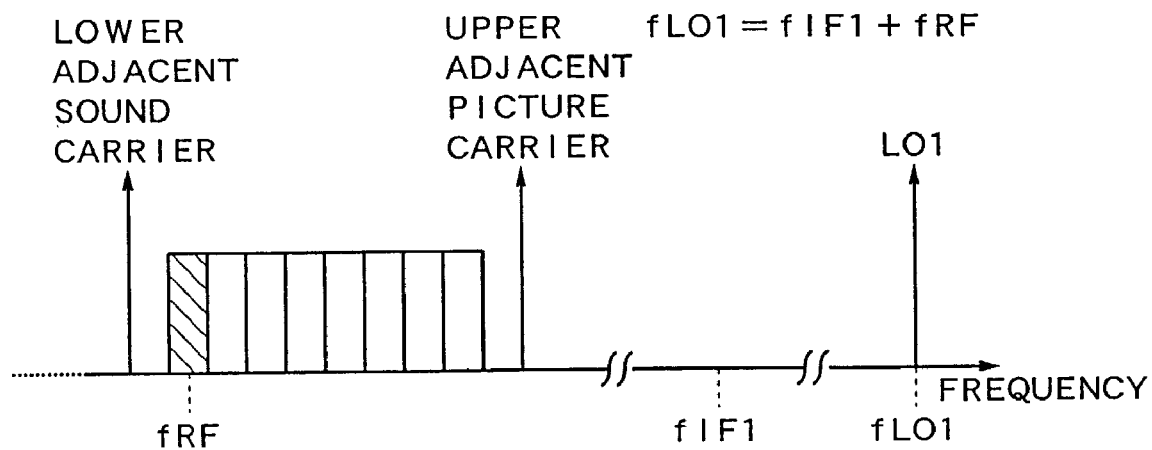
FIG. 13A is a spectral diagram showing an RF output in a receiving apparatus of Embodiment 2 (operation 1)
Figure 13B:
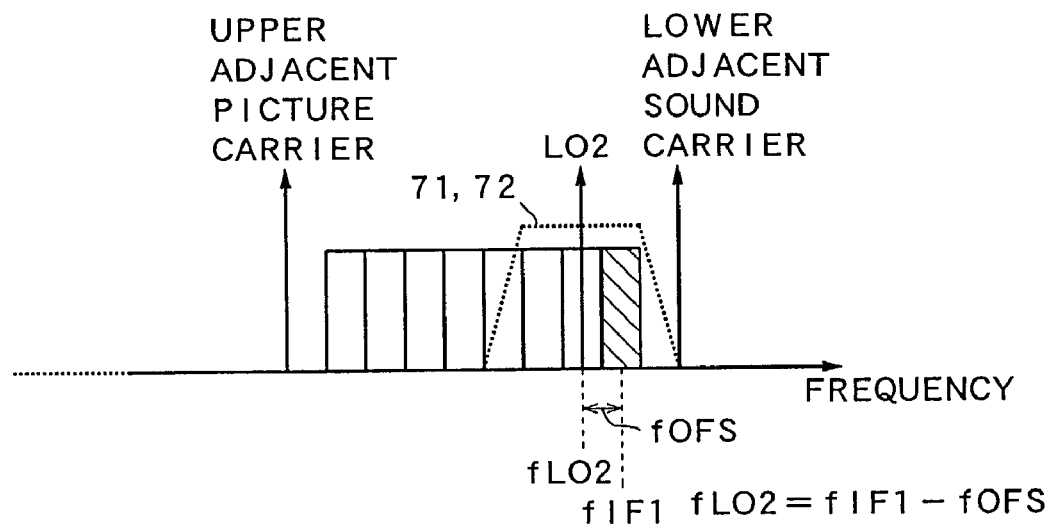
FIG. 13B is a spectral diagram showing an IF output in the receiving apparatus of Embodiment 2 (operation 1)

FIGS. 13A and 14A show spectral diagrams having an NTSC signal of an analog TV exists at upper and lower adjacent channels of the received signal. Similarly, FIGS. 13B and 14B show an NTSC signal of the analog TV of upper and lower adjacent channels converted into the first intermediate frequency fIF1.

An output signal of the mixer 63 is inputted to the BPF 65. The BPF 65 selects only a desired received segment, passes the same and attenuates other segments or signals of adjacent channels. According to this example, a center frequency of the BPF 65 is 1400 MHz and a pass band width is equal to or larger than 1 segment. An output of the BPF 65 is inputted to the IF amplifier 66 and amplified. Then, a result is inputted to a quadrature mixer. The quadrature mixer is a circuit formed by the mixers 67, 68 and the phase shifter 70 shown in FIG. 12.

The mixer 68 performs frequency conversion for an output signal of the IF amplifier 66 by using an oscillation signal LO2 (frequency: fLO2) of the PLL 69. A local oscillator frequency of the PLL 69 is instructed by the control section 99. The mixer 67 performs frequency conversion for an output signal of the IF amplifier 66 by using a signal obtained by phase-shifting an oscillation signal of the PLL 69 by 90° at the phase shifter 70. As for the phase shifter 70, a 90° phase shifter can be used because a quadrature precision is ensured in a narrow frequency range next to the first intermediate frequency fIF1. A method of obtaining 90° by a divider described in a conventional example may be applied. Nevertheless, an oscillation frequency of the PLL 69 must be set to be two or four times larger than 1400 MHz, so that a frequency becomes high. Thus, there arise problems in that an oscillator or a frequency divider is hardly realized and power consumption becomes high.

The quadrature mixer including the mixers 67 and 68 performs quadrature detection and outputs a complex base band signal. Here, an output of the mixer 67 is referred to as a base band signal I with a real axis. An output of the mixer 68 is referred to as a base band signal Q with an imaginary axis. The quadrature detection intentionally includes a frequency offset fOFS of the carrier. The frequency offset is, in accordance with a conventional example, fOFS=500 kHz.

In both cases of successively sending either eight segments or twelve segments, where a segment with the lowest or the second lowest frequency is received as shown in FIG. 13A, the quadrature mixer performs frequency conversion by using the frequency relationship fLO2=fIF1−fOFS as shown in FIG. 13B. As shown in FIG. 14A, when the first highest or second highest segment is received, the quadrature mixer performs frequency conversion by using the frequency relationship fLO2=fIF1+fOFS as shown in FIG. 14B. When a segment with the third lowest or successive frequency or a segment with the third highest or successive frequency is received, the frequency relationship fLO2=fIF1−FOFS shown in FIGS. 13A to 13D may be used or the frequency relationship fLO2=fIF1+fOFS shown in FIGS. 14A to 14D may be used. Partial reception for UHF digital terrestrial TV broadcasting is reception of one central segment of thirteen segments. Thus, in accordance with such a condition, the second local oscillator frequency fLO2 may be set by either of the relationships.

As described above, with the control section 99 setting the local oscillator frequency fLO2 of the PLL 69, carriers of a picture or a sound of an adjacent NTSC signal can be removed from the base band of the quadrature detection output. Referring to FIGS. 13B and 14B, characteristics of the LPF 71 and 72 of the base band when a quadrature detection output is inputted to the analog LPF 71 and 72 are shown by dotted lines. The quadrature detection operation refers to a frequency shift operation where the spectrum of the RF or IF signal are shifted. Here, the frequency shift is performed such that the second local oscillator frequency fLO2 is placed at DC (zero frequency). Thus, when the characteristics of the LPF 71 and 72 of the base band are equivalently represented at a stage of intermediate frequency fIF1, an LPF characteristic shown by dotted lines with a position of the local oscillator frequency fLO2 being a center. As a quadrature detection output is indicated by I and Q complex signals, a negative frequency area can be handled at a base band.

Figure 13C:
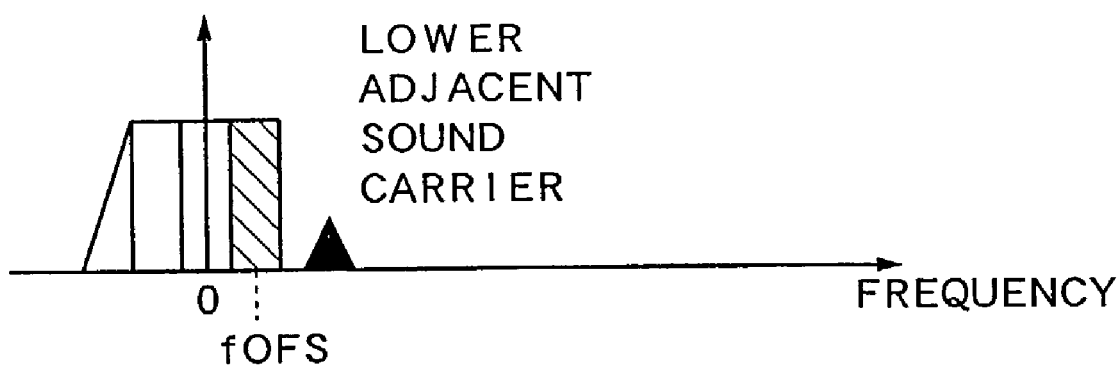
FIG. 13C is a spectral diagram showing a BB output in the receiving apparatus of Embodiment 2 (operation 1)
Figure 14C:
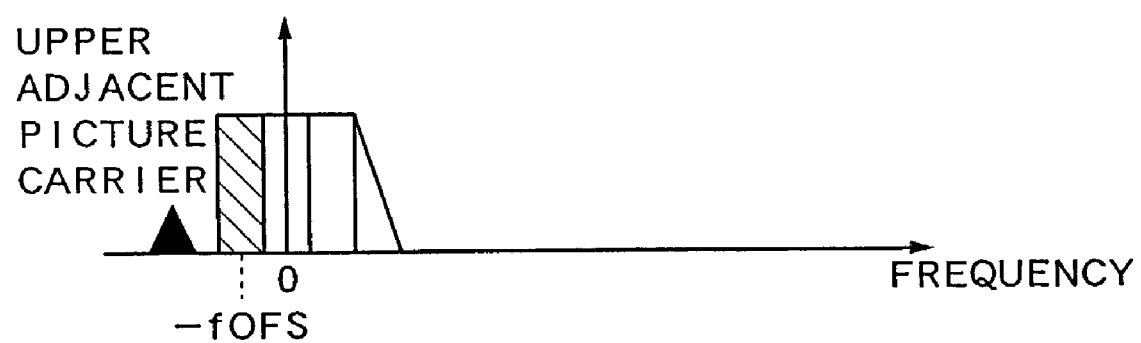
FIG. 14C is a spectral diagram showing a BB output in the receiving apparatus of Embodiment 2 (operation 2)

When a lower band segment is received, the base band signal output of the quadrature mixer is shown in FIG. 13C. A cut-off frequency of the LPF needs to be 715 kHz or higher, considering a frequency offset fOFS=500 kHz and 429 kHz of bandwidth of one segment. If a sound carrier of a lower adjacent NTSC cannot be sufficiently suppressed by the BPF 65 and the LPF 71 and 72, a residual component is generated as shown in FIG. 13C. An output signal of the quadrature mixer for the upper band segment is shown in FIG. 14C. Similarly, when a picture carrier of the upper adjacent NTSC cannot be sufficiently suppressed by the BPF 65 and the LPF 71 and 72, a residual component is generated as shown in FIG. 14C. In order to suppress such adjacent carriers by the LPF, it is advantageous to decrease a cut-off frequency of the LPF. Accordingly, a smaller frequency offset fOFS is desirably selected.

When an upper or lower segment of the received signal is received as shown in FIGS. 13A to 13D and 14A to 14D, it is expected that an adjacent NTSC signal cannot be sufficiently suppressed by the LPF 71 and 72. Further, at a time of sampling at the ADC 91 and 92, an aliasing noise is generated and may enter within a band. In order to prevent such a drawback, it is desirable to change a sampling frequency of the ADC 91 and 92 to an optimum value depending on a position of the received segment. In general, it is advantageous to set a sampling frequency as low as possible in view of reduction in the power consumption of the A/D converter. When a disturbance by the aliasing noise is generated, a sampling frequency must be set such that the disturbance does not enter the band.

An output of the LPF 71 is amplified by the BB amplifier 201 so as to be a required input level of the subsequent ADC 91. Similarly, an output of the LPF 72 is amplified by the BB amplifier 202 so as to be a required input level of the subsequent ADC 92. The ADC 91 converts an output of the BB amplifier 201 into a digital signal. Similarly, the ADC 92 converts an output of the BB amplifier 202 into a digital signal. Outputs of the ADC 91 and 92 are shown in FIGS. 13C and 14C. A received segment still has a frequency offset of ±fOFS.

Assuming that a complex base band signal of received segment shown in FIG. 13C by hatching is indicated by (I+jQ), a state of the received segment shown in FIG. 13C is represented as follows.

$$(I+jQ) \times \exp(j\omega OFS \cdot t)$$

Figure 13D:
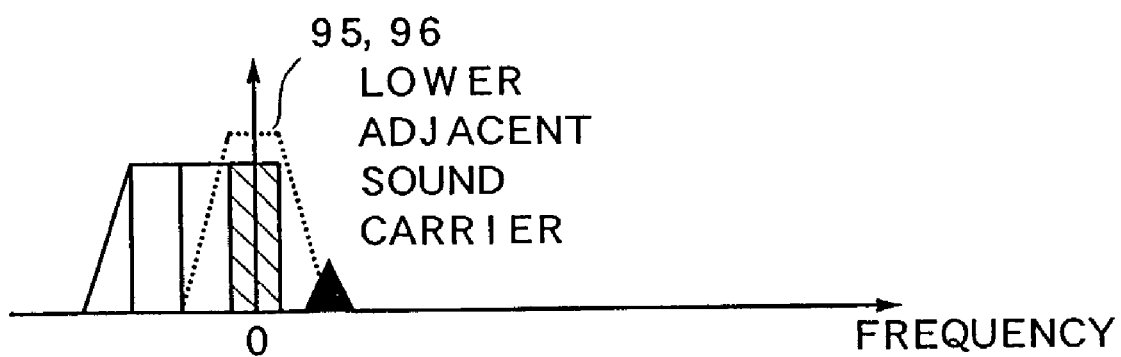
FIG. 13D is a spectral diagram showing an output of complex multiplier in the receiving apparatus of Embodiment 2 (operation 1)
Figure 14D:
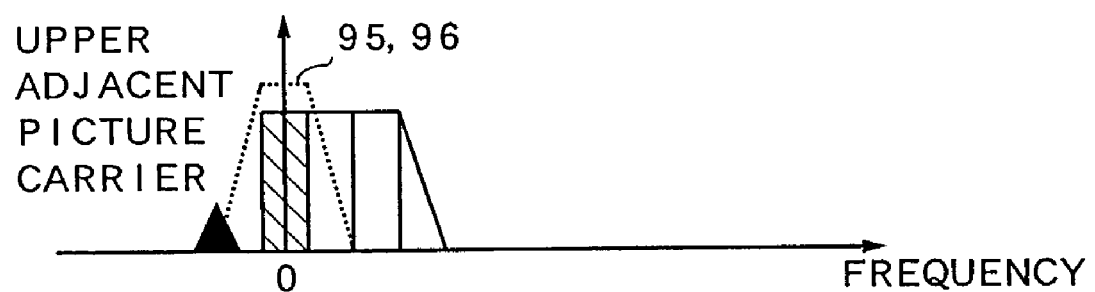
FIG. 14D is a spectral diagram showing an output of a complex multiplier in the receiving apparatus of Embodiment 2 (operation 2)

At the NCO 94, a complex wave $\exp(-j\omega OFS \cdot t)$ is generated. At the complex-multiplier 93, the complex wave is complex multiplied by outputs of the ADC 91 and 92 such that the term "exp( )" is eliminated and the base band signal of (I+jQ) can be reproduced. A state after the frequency offset correction is shown in FIG. 13D. Referring to FIG. 14C, the sign of the frequency offset included in a signal is inverted, the polarity of the complex wave of the NCO 94 is inverted and $\exp(+j\omega OFS \cdot t)$ is provided. A state after a frequency offset correction is shown in FIG. 14D.

When a frequency offset ±fOFS is set by the PLL 69 depending on a position of the received segment, the control section 99 changes the corresponding value and sign of the corrected value of the frequency offset of the NCO 94. The amount of correction of the frequency offset of the NCO 94 is set to a fixed value. Nevertheless, a frequency error is generated by the temperature characteristics of the PLL 64 and PLL 69 and thus a frequency offset cannot be perfectly corrected by an output of the complex multiplier 93. A remaining frequency offset of a smaller frequency can be corrected by an AFC loop within the OFDM demodulator 97. Alternatively, the complex multiplier 93 and the NCO 94 may be used as a part of the AFC loop. Carrier frequency error information detected at the OFDM demodulator 97 can be fed back to the NCO 94 such that an AFC feedback loop is formed.

FIG. 15 shows a block diagram showing a structural example of the NCO 94. The NCO 94 is configured so as to include an adder 101, a latch circuit (D) 102 and data conversion circuits 103 and 104. An accumulating adder 105 is formed by the adder 101 and the latch circuit 102. The accumulating adder 105 is an adder which does not prohibit an overflow and performs conversion from an instantaneous frequency serving as a frequency offset value set at a data setting terminal 106 to an instantaneous phase by its integration operation. An output signal of the accumulating adder 105 is converted into a quadrature signal at the data conversion circuit 103 with a cosine characteristic and the data conversion circuit 104 with a sine characteristic and a resultant signal is outputted to the complex multiplier 93 shown in FIG. 12. The data conversion circuits 103 and 104 can be realized by a ROM or an operation circuit by functional approximation.

Outputs of the complex multiplier 93 are subjected to band limitation at the digital LPF 95 and 96 having band widths of the segment width. Since the bandwidths are the same and one segment has 429 kHz at a complex frequency area, the cut-off frequency of the LPFs must be 215 kHz or higher. Here, a margin of shift in frequency of the base band signal due to temperature characteristics of the PLL 64 and the PLL 69 must be added. The LPF 95 and 96 suppresses the unnecessary adjacent NTSC signal component or signal component of other segments. Since image rejection is not completed at the analog stage, quadrature detection is performed only at the analog stage and the digital LPF is used for removing an image band, high image rejection performance can be obtained. Switching of the polarity of image rejection, i.e., switching between the frequency relationship shown in FIGS. 13A to 13D and the frequency relationship shown in FIGS. 14A to 14D can be processed only by changing settings of the second local oscillator frequency fLO2 at the PLL 69 and a frequency offset fOFS at the NCO 94. For this reason, deterioration of the image rejection performance caused by switching does not occur.

A complex base band signal outputted from the LPF 95 and 96 is supplied to the OFDM demodulator 97. The OFDM demodulator performs a demodulation process such as complex Fourier transform, frequency deinterleave, time deinterleave and error correction in accordance with a modulation process at the time of sending and ISDB-T. In this way, TS is outputted from the TS output terminal 98. By decoding this TS at a subsequent back end (not shown), a video and an audio signal are reproduced.

A spectral polarity of the received segment in FIGS. 13A to 13D is the same as that of FIGS. 14A to 14D but a spectrum of the sent signal is inverted at a time of frequency conversion at the mixer 63. This can be corrected as follows. Namely, in a digital signal process within the OFDM demodulator 97, one of the signs of the signal I with a real axis and signal Q with an imaginary axis subjected to the quadrature detection may be inverted, I may be changed to Q, or the up-and-down relationship of the spectrum subjected to the FFT process may be rearranged.

As described above, the receiving apparatus 90 of this embodiment can operate the quadrature mixer including the mixers 67 and 68 at an almost single frequency in order to convert into the first intermediate frequency fIF1 at a time of frequency conversion by the mixer 63. Thus, reception of wide-band ranging from VHF to UHF is possible. At an analog state, only quadrature detection is performed and removal of the signal of other segments corresponding to an image band is performed by digital LPFs at a time of the digital process. Thus, an image rejection performance can be ensured with high precision. At the same time, a polarity of image rejection can be easily switched only by switching setting of the frequency of the PLL 69 and the NCO 94 by the control section 99. Further, since a signal is treated such that a carrier frequency offset is added at an analog stage, a DC offset needs not be precisely managed and the circuit can be formed by a capacity coupling circuit.

The RF amplifier 62 may be formed by an AGC amplifier and power is measured at an output of the mixer 63, so that AGC control can be performed. At this case, the AGC control can be performed by the power including an adjacent signal. Thus, even if an adjacent interfering signal with a larger power than a received signal exists, generation of non-linear distortion of the RF amplifier 62 and the mixer 63 can be prevented. Similarly, the IF amplifier 66 may be formed by an AGC amplifier and power is measured at the outputs of the mixers 67 and 68, so that AGC control can be performed. At this time, since the AGC control can be performed by the power including an adjacent signal that cannot be removed by the BPF 65, generation of non-linear distortion of the IF amplifier 66 and the mixers 67, 68 can be prevented. Then, the base band amplifiers (BB amplifiers) 201 and 202 are controlled by the OFDM demodulator 97.

At outputs of the LPF 71 and 72, an adjacent signal component is sufficiently suppressed and an almost desired signal is provided. Thus, the BB amplifiers 201 and 202 must perform the following correction operation. Namely, in a case in which an adjacent interfering signal is large, when the power of the desired received signal is suppressed by the RF amplifier 62 or the IF amplifier 66, the BB amplifiers 201 and 202 correct such suppression to a level appropriate for being inputted to the ADC 91 and 92. When a tuning frequency can be controlled by a control voltage with respect to the antenna 61, this function can be used as an AGC at a stage of RF. For example, while monitoring a control voltage of the RF amplifier 62, if an input level of the RF amplifier 62 exceeds a determined level, tuning of the antenna 61 is shifted and control is performed such that the input level of the RF amplifier 62 is accommodated within a determined value.

While the bandwidth of the BPF 65 is set to be a narrow value, e.g., around one segment at minimum, when it is difficult to realize a narrow band filter, a wideband with around 6 MHz may be provided. At this time, one channel of received RF signals is subjected to a conversion into a first intermediate frequency by using the frequency relationship fLO1=fIF1+fRF and the frequency of the local oscillation signal LO2 is selected for each received segment. Thus, each of the segments can be selected. Alternatively, the local oscillator frequency fLO1 is changed for each received segment and an intermediate frequency fIF1 is adjusted such that an adjacent interfering signal overlies a cut-off frequency of the BPF 65. consequently, even if the BPF 65 has a wideband, performance of removing an adjusting signal can be ensured.

The first intermediate frequency fIF1=1400 MHz and a frequency offset fOFS=500 kHz are only examples and the present invention does not limit such frequencies. Although frequency conversion at the mixer 63 is described using Upper LO, Lower LO may be used.

Next, an application example of Embodiment 2 will be described.

FIGS. 16A to 16D and 17A to 17C are spectral diagrams obtained when the receiving apparatus of Embodiment 2 is applied to a reception of all of the thirteen segments of the ISDB-T for digital terrestrial TV broadcasting and of the OFDM signal such as DVB-T. In order for a reader to easily understand a spectral polarity of the received signal before and after frequency conversion, a frequency characteristic is shown as intentionally tapered. This receiving apparatus has the same structure as that of FIG. 12 except that the LPF 71, 72 and LPF 95 and 96 has a wideband and a sampling frequency of the ADC 91, 92 is set to be high.

Figure 16A:
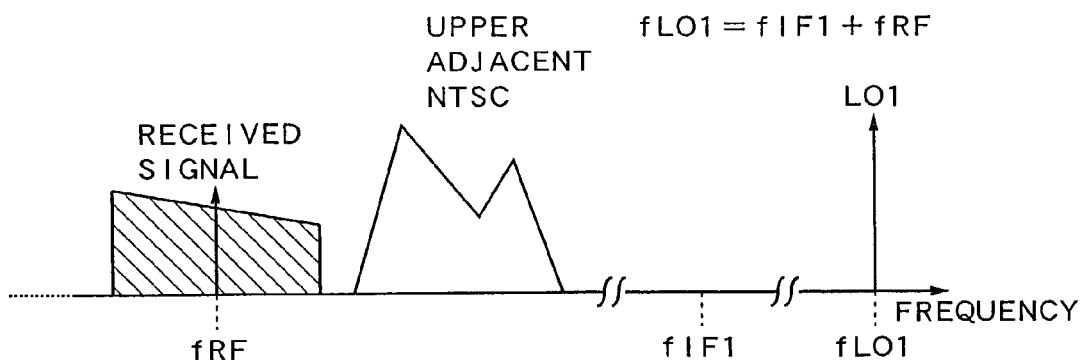
FIG. 16A is a spectral diagram showing an RF output in the receiving apparatus of Embodiment 2 (application example 1)
Figure 16B:
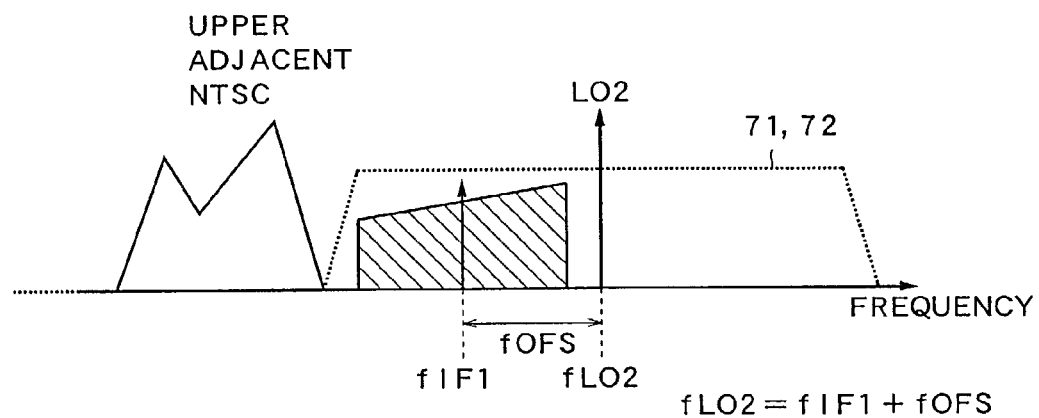
FIG. 16B is a spectral diagram showing an IF output in the receiving apparatus of Embodiment 2 (application example 1)
Figure 16C:
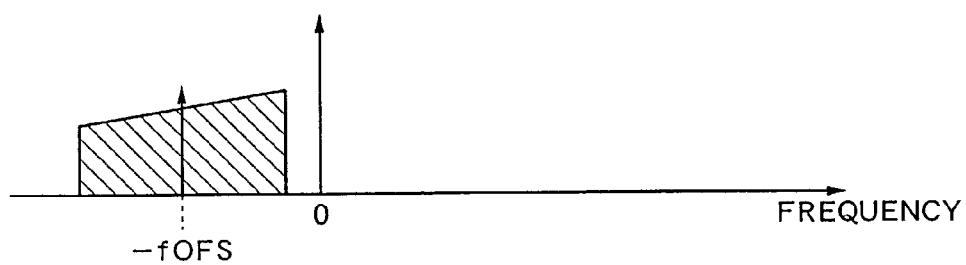
FIG. 16C is a spectral diagram showing a BB output in the receiving apparatus of Embodiment 2 (application example 1)
Figure 16D:
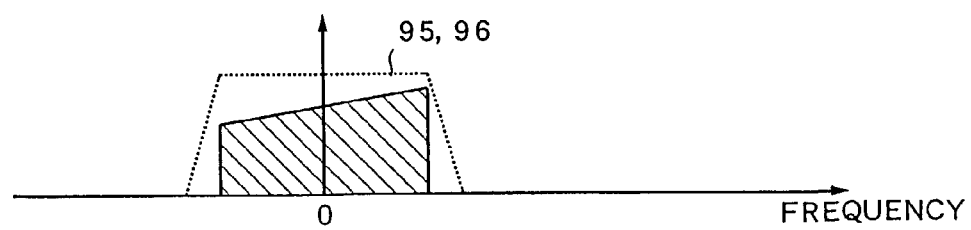
FIG. 16D is a spectral diagram showing an output of complex multiplier in the receiving apparatus of Embodiment 2 (application example 1)
Figure 17A:
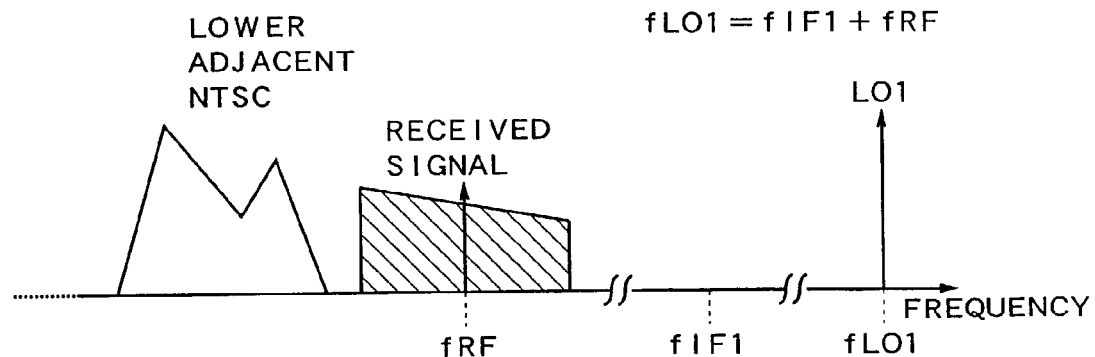
FIG. 17A is a spectral diagram showing an RF output in the receiving apparatus of Embodiment 2 (application example 2)

FIGS. 16A to 16D are spectral diagrams with an upper adjacent NTSC signal. FIGS. 17A to 17D are spectral diagrams with a lower adjacent NTSC signal. For example, a first intermediate frequency fIF1 is 1400 MHz and a frequency band fRF of a received signal is in a range of 470 to 770 MHz. Even if either an upper adjacent interfering signal or a lower adjacent interfering signal exists, the local oscillator frequency fLO1 by the first frequency conversion of the mixer 63 is 1870 to 2170 MHz as Upper LO by the relationship fLO1=fIF1+fRF. Such a state is shown in FIGS. 16A and 17A.

Figure 17B:
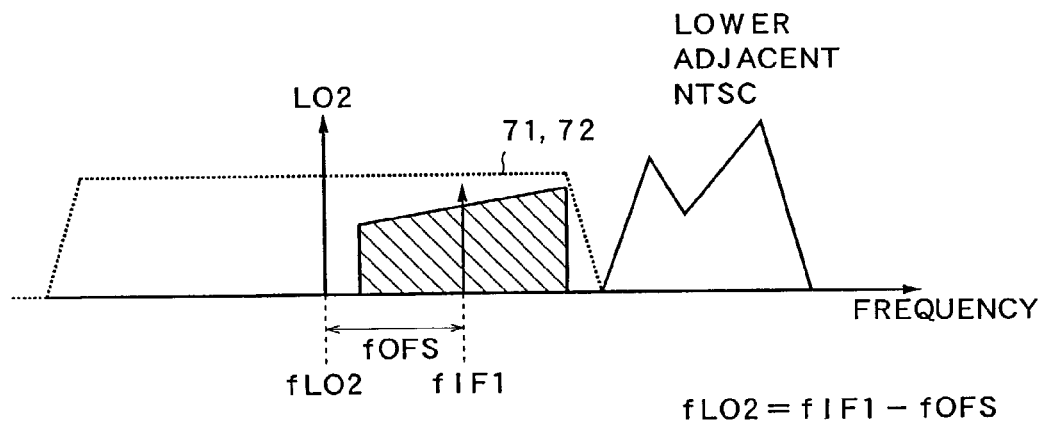
FIG. 17B is a spectral diagram showing an IF output in the receiving apparatus of Embodiment 2 (application example 2)

Next, a local oscillator frequency fLO2 of the second frequency conversion by the mixers 67 and 68 is defined. As shown in FIGS. 16A to 16D, if an upper adjacent NTSC signal exists, the control section 99 sets fLO2=1404 MHz by the relationship fLO2=fIF1+fOFS with fOFS=4 MHz. Such a state is shown in FIG. 16B. As shown in FIGS. 17A to 17D, if a lower adjacent NTSC signal exists, fLO2 is set to 1396 MHz according to the formula fLO2=fIF1−fOFS. Such a state is shown in FIG. 17B. Referring to these diagrams, the frequency characteristics of the LPF 71, 72 at the base band are shown in a frequency area with fLO2 at its center. By switching of the above-described second local oscillator frequency fLO2, at a base band of the output of the quadrature mixer including the mixers 67 and 68, an adjacent NTSC signal can be removed by the LPF 71 and 72 in both cases of upper and lower adjacent interfering signals.

Figure 17C:
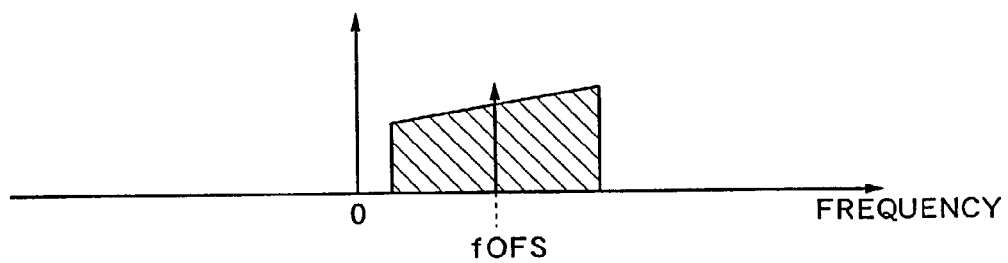
FIG. 17C is a spectral diagram showing a BB output in the receiving apparatus of Embodiment 2 (application example 2)
Figure 17D:
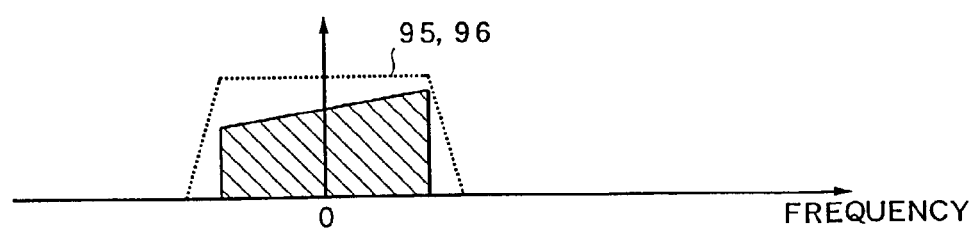
FIG. 17D is a spectral diagram showing an output of complex multiplier in the receiving apparatus of Embodiment 2 (application example 2)

In the base band, if an upper adjacent interfering signal exists, the base band signal can be obtained at −fOFS. Such a state is shown in FIG. 16C. If a lower adjacent interfering signal exists, a base band signalcan be obtained at +fOFS. Such a state is shown in FIG. 17C. The control section 99 switches an oscillator frequency of the NCO 94 to +fOFS when an upper adjacent interfering signal exists and to −fOFS when a lower adjacent interfering signal exists. In this way, a frequency offset can be corrected at the complex multiplier 93. Such a state is shown in FIGS. 16D and 17D. A spectral polarity of FIG. 16D is inverted from that of FIG. 17D. For this reason, in a digital signal process within the OFDM demodulator 97, one of signs of the signal I with a real axis and the signal Q with an imaginary axis subjected to quadrature detection may be inverted, or I may be changed to Q. Alternatively, the high-low order of the frequency of spectrum subjected to the FFT process may be rearranged. In this way, correction can be performed. If the first local oscillator frequency fLO1 is the Lower LO, the relationship between the upper and lower adjacent interfering signals and a polarity of the frequency offset of the second local oscillator frequency fLO2 is set so as to be opposite to the above description.

As a method of detecting an existence of an adjacent interfering signal, there is provided a method of detecting upper and lower adjacent signal components from a result of performing the FFT for a received signal at the OFDM demodulator 97. If a bit error rate or receiving C/N subsequent to demodulation of the received signal is inferior, a polarity of the frequency offset of the local oscillator frequency fLO2 may be switched.

As described above, in accordance with the receiving apparatus of this application example, the control section 99 detects an upper or lower adjacent interfering signal and switches the local oscillator frequency fLO2 inputted to the mixers 67, 68 between a frequency higher than the first intermediate frequency and a frequency lower than the same. Thus, an adjacent interfering signal can be set so as to be outside the band of the quadrature mixer and the LPF 71, 72. consequently, an image rejection performance can be ensured with high precision and an adjacent interfering signal can also be suppressed. However, if upper and lower adjacent interfering signals exist, the advantages of this system cannot be obtained.

This system may be applied to modulation systems other than OFDM, i.e., reception of a digital modulation signal such as QPSK, QAM and VSB.

In accordance with Embodiments 1 and 2, an LPF within a base band can be formed within an IC. Thus, referring to FIG. 7, components from the RF amplifier 62 to the LPF 78 can be made into a one chip IC. Referring to FIG. 12, components from the RF amplifier 62 to the BB amplifiers 201 and 202 can be made into a one chip IC. Here, in either of the cases, the BPF 65 is not included in the IC.

When a compact receiving apparatus with a structure of Embodiment 1 or 2 is realized and built in, e.g., a mobile phone, a service which utilizes a down link for broadcasting and an up link for communication in a bidirectional manner can be realized. At this time, a frequency must be determined such that the oscillator frequency (fLO1, fLO2) and the intermediate frequency (fIF1, fIF2) of the PLL 64 and the PLL 69 shown in FIGS. 7 and 12 do not overlap a receiving frequency band of the mobile phone. A reference clock of the PLL 64, 69, OFDM demodulator 80 or 97 is synchronized by sharing a reference clock of the mobile phone, so that generation of beat disturbance can be prevented.

Embodiment 3

Next, a receiving apparatus 60D according to Embodiment 3 of the present invention will be described. In accordance with this embodiment, two series of receiving apparatuses of Embodiment 1 are arranged in parallel in order to improve fading durability at a time of mobile reception and a space diversity receiver is formed. In this case, two series of OFDM demodulators 80 shown in FIG. 7 are prepared and a selection or weighted composition is performed for each carrier at FFT outputs of the receiving apparatuses, so that 2 series of received signals are integrated.

Figure 18:
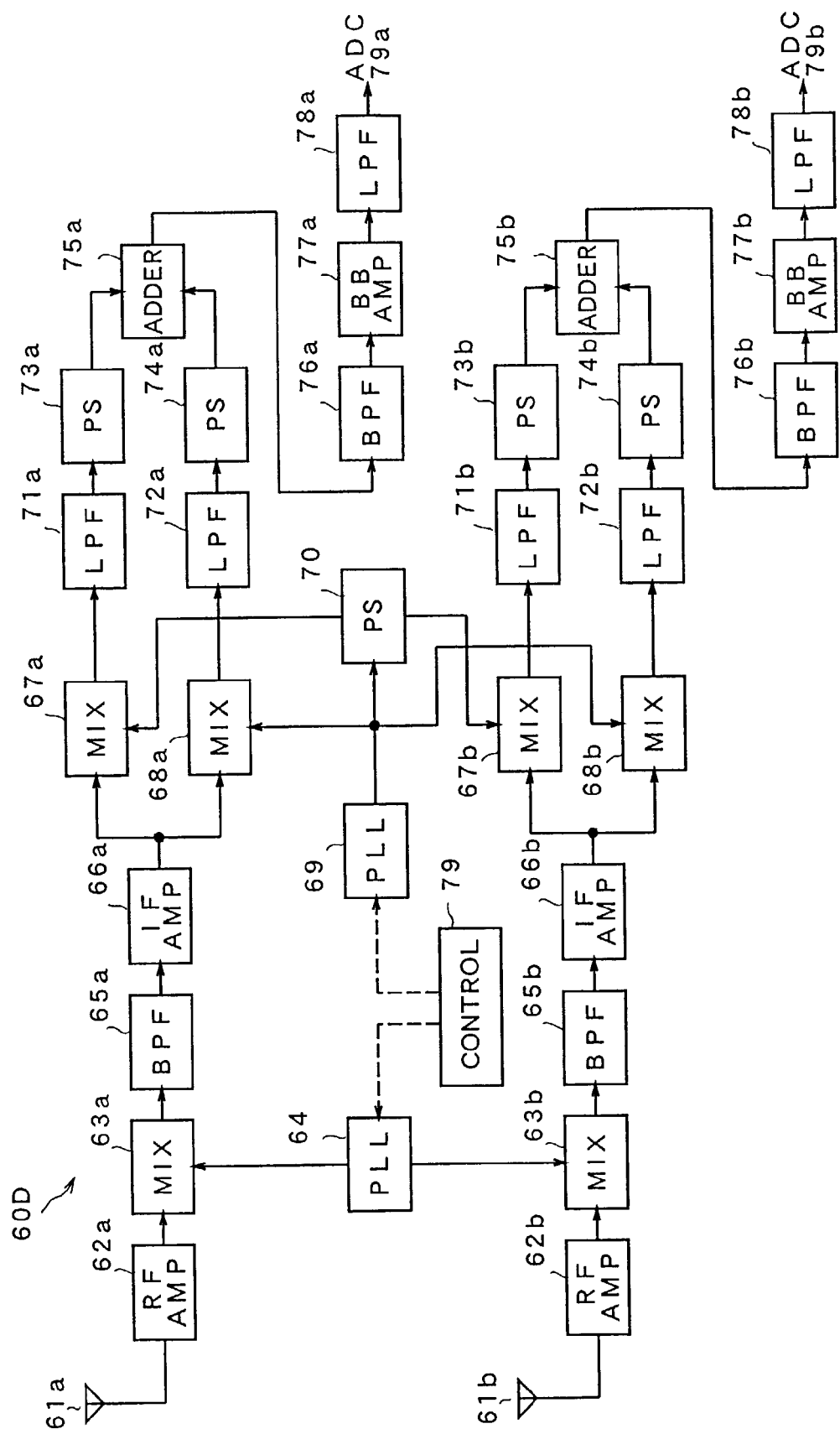
FIG. 18 is a block diagram showing a structure of a tuner portion of the receiving apparatus of Embodiment 3.

FIG. 18 is a configuration view showing a tuner portion of the receiving apparatus 60D of this embodiment. In accordance with the tuner portion of the receiving apparatus 60D, a first tuner portion and a second tuner portion are provided in parallel. The first tuner portion is configured so as to include an antenna 61a, an RF amplifier 62a, a mixer 63a, a PLL 64, a BPF 65a, an IF amplifier 66a, mixers 67a, 68a, a PLL 69, a phase shifter 70, LPF 71a, 72a, phase shifters 73a, 74a, an adder 75a, a BPF 76a, a BB amplifier 77a, an LPF 78a and a control section 79.

The second tuner portion is configured so as to include an antenna 61b, an RF amplifier 62b, a mixer 63b, a PLL 64, a BPF 65b, an IF amplifier 66b, mixers 67b, 68b, a PLL 69, a phase shifter 70, LPF 71b, 72b, phase shifters 73b, 74b, an adder 75b, a BPF 76b, a BB amplifier 77b, an LPF 78b and a control section 79.

The PLL 64, 69, the phase shifter 70 and the control section 79 are shared by the first and second tuner portions. This system is desirable in view of preventing beat disturbance between oscillators within the tuners. Referring to FIG. 18, two series of circuits subsequent to the ADC 79 are required.

In accordance with such structure, when a segment serving as a part of the received signal is selected and received, digital demodulation is performed by using an output of the image rejection mixer at each series and data with high reliability can be reproduced by selection or weighted adding of each of the demodulation results.

When a signal subjected to digital modulation is received under a circumstance that an adjacent signal exists, digital demodulation is performed by using an output of the image rejection mixer at each series and data with high reliability can be reproduced by selection or weighted adding of each of the demodulation results.

Embodiment 4

Next, a receiving apparatus 90D according to Embodiment 4 of the present invention will be described. In accordance with this embodiment, two series of receiving apparatuses according to Embodiment 2 are arranged in parallel such that a space diversity receiver is formed in order to improve fading durability at a time of mobile reception. In this case, two series of OFDM demodulators 97 shown in FIG. 12 are also prepared and two series of received signals are synthesized by performing selection or weighted adding for each carrier at outputs of the receiving apparatuses.

Figure 19:
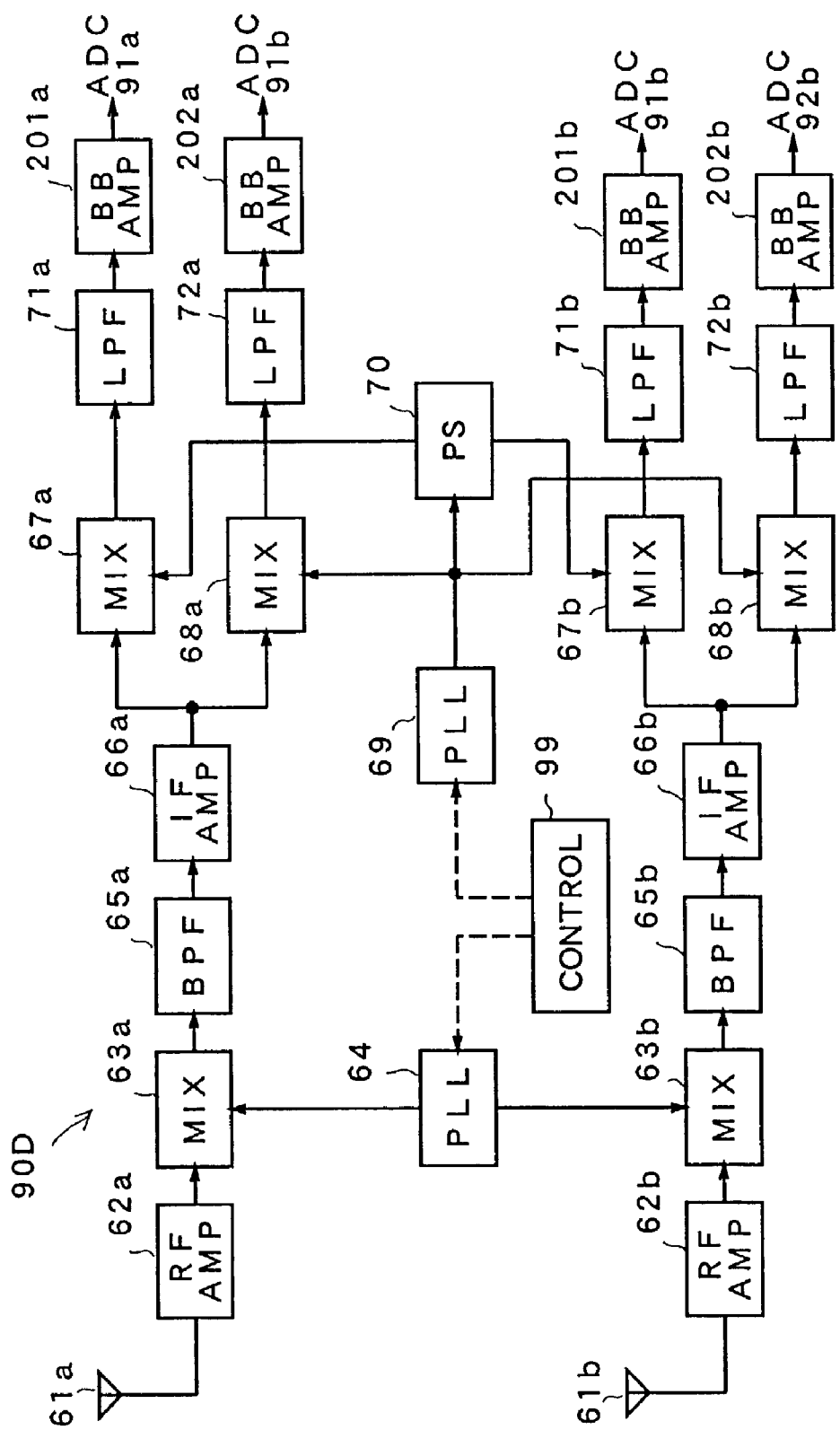
FIG. 19 is a block diagram showing a structure of a tuner portion of the receiving apparatus of Embodiment 4.

FIG. 19 is a configuration view showing a tuner portion of the receiving apparatus 90D of this embodiment. The tuner portion of the receiving apparatus 90D is formed by arranging a first tuner portion and a second tuner portion in parallel. The first tuner portion is configured so as to include an antenna 61a, an RF amplifier 62a, a mixer 63a, a PLL 64, a BPF 65a, an IF amplifier 66a, mixers 67a, 68a, a PLL 69, a phase shifter 70, LPF 71a, 72a, BB amplifiers 73a, 74a and a control section 99.

The second tuner portion is configured so as to include an antenna 61b, an RF amplifier 62b, a mixer 63b, a PLL 64, a BPF 65b, an IF amplifier 66b, mixers 67b, 68b, a PLL 69, a phase shifter 70, LPF 71b, 72b, BB amplifiers 73b, 74b and a control section 99.

The PLL 64, 69 and the phase shifter 70 are shared by the first and second tuner portions. This system is desirable in view of preventing beat disturbance between oscillators within the tuners. Referring to FIG. 19, two series of circuits subsequent to the ADC 91, 92 of FIG. 12 are required.

In accordance with such structure, when a segment serving as a part of the received signal is selected and received, digital demodulation is performed by using outputs of the quadrature mixers at the respective series and data with high reliability can be reproduced by selection or weighted adding of the results of the demodulation.

When a signal subjected to digital modulation is received under a circumstance that an adjacent signal exists, digital demodulation is performed by using outputs of the quadrature mixers at the respective series and data with high reliability can be reproduced by selection or weighted adding of the results of the demodulation.

As described above, in accordance with the present invention, reception of a wide-band from VHF to UHF can be performed in the receiving apparatus which partially receives an ISDB-T modulation signal or the receiving apparatus which receives an entire ISDB-T modulation signal or a DVB-T modulation signal. Further, the receiving apparatus with a high degree of selection which does not deteriorate image rejection performance regardless of a position of the received segment or an adjacent interfering signal.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese priority application no. 2001-306121 filed on Oct. 2, 2001 is hereby incorporated by reference.

What is claimed is:

1. A receiving apparatus for performing OFDM modulation on a received signal having a plurality of segments, the received signal having a received frequency band, comprising:
    a first local oscillator for generating a first local oscillating frequency signal;
    a first mixer which converts a frequency of the received signal into a first intermediate frequency signal using the first local oscillating frequency signal, said first intermediate frequency signal having a frequency higher than the frequency of the received frequency band;
    a second local oscillator for generating a second local oscillating frequency signal having an offset frequency that is offset from the first intermediate frequency signal;
    a quadrature mixer which performs quadrature detection of an output of said first mixer by using the second local oscillating frequency signal;
    a numerical control oscillator which generates a complex wave with the offset frequency;
    a control section which changes a sign of the offset frequency of said second local oscillator and changes a sign of the complex wave of said numerical control oscillator according to a frequency of a received and selected segment that is part of the received signal;
    a complex multiplier which complex multiplies the output signals of said quadrature mixer and the complex wave generated by said numerical control oscillator to correct the offset frequency, and outputs I and Q signals;
    low pass filters which cut off high band components of the I and Q signals outputted from said complex multiplier, respectively; and
    an OFDM demodulator which performs a demodulation process including complex Fourier transform, deinterleave, and error correction by using output signals of said low pass filters.

2. The receiving apparatus according to claim 1,
    wherein said control section controls the second local oscillating frequency signal to be lower than the first intermediate frequency signal by an amount equal to the frequency offset when said receiving apparatus receives a segment at a lower side of a broadcast band; and
    wherein said control section controls the second local oscillating frequency to be higher than the first intermediate frequency by an amount equal to the frequency offset when said receiving apparatus receives a segment at a higher side of the broadcast band.

3. The receiving apparatus according to claim 1, wherein the received and selected segment has a band width and the frequency offset is greater than half of the band width of the received and selected segment, and is less than the band width.

4. A receiving apparatus for obtaining a received signal and performing digital modulation thereon, comprising:
    a first local oscillator for generating a first local oscillating frequency signal;
    a first mixer which converts a frequency of the received signal into a first intermediate frequency signal using said first local oscillating frequency signal, said first intermediate frequency signal having a frequency higher than the frequency of the received frequency band;
    a second local oscillator for generating a second local oscillating frequency signal having an offset frequency that is offset from the first intermediate frequency signal;
    a quadrature mixer which performs quadrature detection of an output of said first mixer by using the second local oscillating frequency signal;
    a numerical control oscillator which generates a complex wave with the offset frequency;
    a control section which changes a sign of the offset frequency of said second local oscillator and changes a sign of the complex wave of said numerical control oscillator according to a relative position of the received signal and an existing adjacent signal;
    a complex multiplier which complex multiplies the output signals of said quadrature mixer and the complex wave generated by said numerical control oscillator to correct the offset frequency, and outputs I and Q signals; and
    low pass filters which cut off high band components of the I and Q signals outputted from said complex multiplier, respectively.

5. The receiving apparatus according to claim 4, wherein said control section controls the second local oscillator frequency signal to be lower than the first intermediate frequency signal by an amount equal to the frequency offset when a frequency of the adjacent signal is lower than the frequency of the received signal; and wherein said control section controls the second local oscillating frequency signal to be higher than the first intermediate frequency by an amount equal to the frequency offset when the frequency of the adjacent signal is higher than the frequency of the received signal.

6. The receiving apparatus according to claim 4, wherein the received signal has a band width and the frequency offset is greater than half of the band width of the received signal, and is less than the band width.

* * * * *